United States Patent [19]

Nasuta et al.

[11] Patent Number: 4,488,301

[45] Date of Patent: Dec. 11, 1984

[54] SYSTEM FOR ANALYZING COMPLEX SIGNALS

[75] Inventors: Anthony T. Nasuta; Robert A. Boenning, both of Timonium, Md.; Mark G. Kraus, Pittsburgh, Pa.

[73] Assignee: Westinghouse Electric Corp., Pittsburgh, Pa.

[21] Appl. No.: 383,447

[22] Filed: Jun. 1, 1982

[51] Int. Cl.[3] .............. G08B 21/00
[52] U.S. Cl. .............. 371/25; 371/26
[58] Field of Search .............. 371/25, 26; 324/73 R

[56] References Cited

U.S. PATENT DOCUMENTS

| | | | |
|---|---|---|---|
| 3,573,751 | 4/1971 | DeLisle | 371/25 |
| 3,976,940 | 8/1976 | Chau et al. | 371/25 |
| 4,001,818 | 1/1977 | Radichel et al. | 371/25 |
| 4,161,276 | 7/1979 | Sacher et al. | 371/25 |
| 4,313,200 | 1/1982 | Nishiura | 371/25 |

OTHER PUBLICATIONS

Zobniw, Hardware-Generated Signature Analysis Trace Diagnosis, IBM Technical Disclosure Bulletin, vol. 24-7A, 12/81.

*Primary Examiner*—Jerry Smith
*Assistant Examiner*—Mark Ungerman
*Attorney, Agent, or Firm*—J. B. Hinson

[57] ABSTRACT

A test system and method for comparatively analyzing complex signals especially those composed of combinations of pulsed signals related to the operational status of apparatus whose operational status is to be determined, is disclosed. In the preferred embodiment a probe, preferably a capacitive probe, is utilized to sense the electric field generated by electrical apparatus. The output signal of the probe is periodically sampled to generate an array of digital signals. This array is processed using Walsh transformations to generate a reference Walsh transform. A second data base is then generated by similarly sampling the electric field generated by an apparatus whose operational status is to be determined. The second data base is then processed to generate a comparison Walsh transform. The operational status of the apparatus whose operational status is to be determined, is then determined by comparing these Walsh transforms.

8 Claims, 13 Drawing Figures

SYSTEM FOR ANALYZING COMPLEX SIGNALS

BACKGROUND OF THE INVENTION

1. Field of the Invention

The invention relates to test systems and more specifically to test systems for determining the current operational status of apparatus by comparing the Walsh transform of a signal representing the current operational status of the apparatus to the Walsh Transform of a signal representing a known operational status of the apparatus.

2. Description of the Prior Art

Typical prior art techniques for analyzing complex signals relied on some form of Fourier Series calculations. Such analysis can be mathematically precise; however, when the signals being analyzed are composed of many individual square wave signals, processing the signals, especially identifying the individual components of the composite signal to determine if they are present or not can be extremely difficult. It is usually possible to determine the current operational status utilizing Walsh technology without identifying the individual signal components, however, such identification may be very useful. Other prior art test systems are based on a comparative analysis of the infrared patterns emitted by the apparatus under test.

SUMMARY OF THE INVENTION

The preferred embodiment of the invention comprises a test system and test methods for determining the operational status (usually current) of apparatus by comparatively analyzing signals representing a known (acceptable) and an unknown operational status of the apparatus utilizing Walsh Transforms. More specifically, a signal representing a known operational status of the apparatus is sampled to generate a reference data base which is processed using Walsh Transforms to generate a reference array of Walsh coefficients. A signal representing an unknown operational status of the apparatus is then sampled to generate a test data base which is similarly processed to generate a comparison array of Walsh coefficients. The comparison array of Walsh coefficients is compared to the reference array of Walsh coefficients to determine if the unknown operational status of the apparatus is within predetermined limits. Matched filters may be included to identify individual components of a composite signal related to the operational status of the apparatus. Walsh Transforms are fully described in various publications; for example, a textbook titled "Walsh Functions and Applications" by K. Beauchamp, Academic Press 1975.

DESCRIPTION OF THE PREFERRED EMBODIMENT

Figure 1:
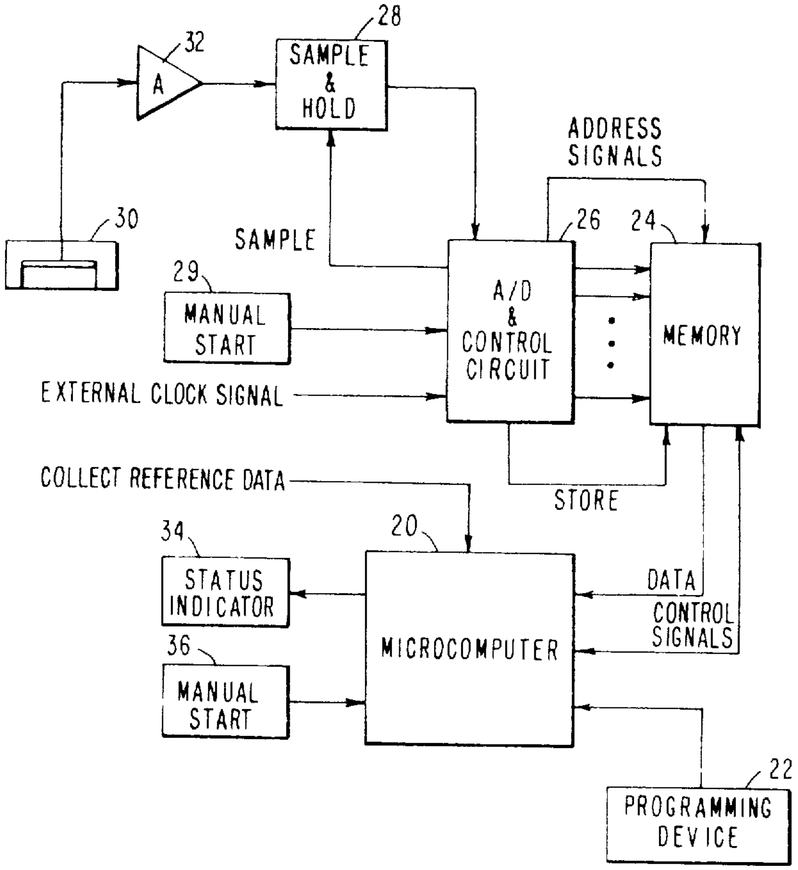
FIG. 1 is a block diagram of the preferred embodiment of the invention.

FIG. 1 is a block diagram of a system comprising the preferred embodiment of the invention. In this embodiment a conventional microprocessor 20 is coupled to receive operating programs and data from a conventional programming device 22. A capacitive probe 30 provides means for coupling a signal indicative of the operational status of electrical apparatus to the input of a buffer amplifier 32. Activation of the manual start apparatus 29 initiates a data collection cycle. Following initiation of the data collection cycle, a sample and hold amplifier 28 is periodically enabled by a control signal from the analog to digital converter and control circuit 26 to produce at the output of this amplifier a stable analog signal representative of the output signal of the probe 30 at the sampling interval with the sampling interval being synchronized by an external clock signal. An analog to digital converter is coupled to receive the output signal of the sample and hold amplifier 28 and generate a digital number representative of the amplitude of each of the stable analog samples. These digital numbers are stored at predetermined storage locations in a random access digital memory 24. After a predetermined number of samples, in the experimental model 1024, have been stored the data collection cycle is automatically terminated.

After completion of the data collection cycle described above, a microprocessor manual start apparatus 36 is activated to initiate the microprocessor 20 to process the data stored in the random access digital memory 24. A digital collect reference data signal coupled to the microprocessor 20 determines whether the data stored in the memory 24 is processed as the reference data base or the comparison data base.

In a typical application the capacitive probe 30 is positioned over an operating integrated circuit, for example, to generate a signal at the input of the buffer amplifier 32 which is related to the various signals generated by the integrated circuit. In the experimental model the capacitor probe 30 was designed to test dual in-line package-integrated circuits and comprises a copper plate approximately the same dimensions as the top surface of the integrated circuit to be tested. The probe 30 was manually positioned with the copper plate in contact with the top surface of the dual in line integrated circuit package. It is believed in this particular application that the principal electrical signals sensed by the probe 30 are the voltage signals that exist at the leads to the integrated circuit package.

To initiate a test, the probe 30 is manually positioned over the integrated circuit which is known to be operating normally using other testing techniques. The external clock signal, preferably the basic timing signal for the integrated circuit, is coupled to the A/D and control circuitry 26. The state of the digital collect reference data signal is selected to indicate that the reference data set is to be collected. Manual start circuit 29 is activated to initiate a data collection cycle to fill all locations in the memory 24 to generate the reference data base. After the data samples forming the reference data base have been stored in the memory 24, the manual start button 36 is depressed, initiating the microprocessor 20 to read the data stored from the memory 24 and calculate the Walsh Transform coefficients of this data. The resulting Walsh Transform coefficients are stored in the internal memory of the microprocessor 20 as the reference Walsh Transform coefficients.

Probe 30 is next manually positioned over a circuit of the same type whose current operational status is to be determined, a suitable external clock signal is provided to the A/D and control circuit 26, and the manual start apparatus 29 is activated to initialize the analog-to-digital converter and control circuit 26 to collect and store data samples in the memory 24 to generate the comparison data base. After the data samples of the comparison data base have been stored in the memory 24, the status of the digital collect reference data signal is charged and the manual microprocessor start apparatus 36 is activated to initiate microprocessor 20 to calculate Walsh Transform coefficients of the comparison data base now stored in the memory 24. The resulting comparison Walsh Transform coefficients are compared to the reference Walsh Transform coefficients and if the difference between these two transforms exceeds a predetermined reference level, a signal is coupled to the status indicator 34 to indicate that the current operational status of the device being tested fails to meet predetermined criteria usually indicating a malfunction. The comparison cycle and the data processing associated therewith will be described in more detail later.

Actual operation of the system illustrated in FIG. 1 will be illustrated by describing how the system is utilized to test a programmable logic array. A programmed logic array (PAL16R6 manufactured by Monolithic Memories, Inc.) when programmed and operated under a first condition. The output signal of buffer amplifier 32 was sampled to generate reference data base comprising a plurality of digital words. These digital words were converted to an analog signal which is labeled and plotted in FIG. 2. This reference data base was also processed to produce reference Walsh Transform coefficients. The reference Walsh Transform coefficients in a digital form were also converted to an analog signal which is labeled and plotted in FIG. 2. These plots (FIG. 2) are not necessary to the functioning of the system, however they are a convenient method of illustrating the data processing.

Figure 3:
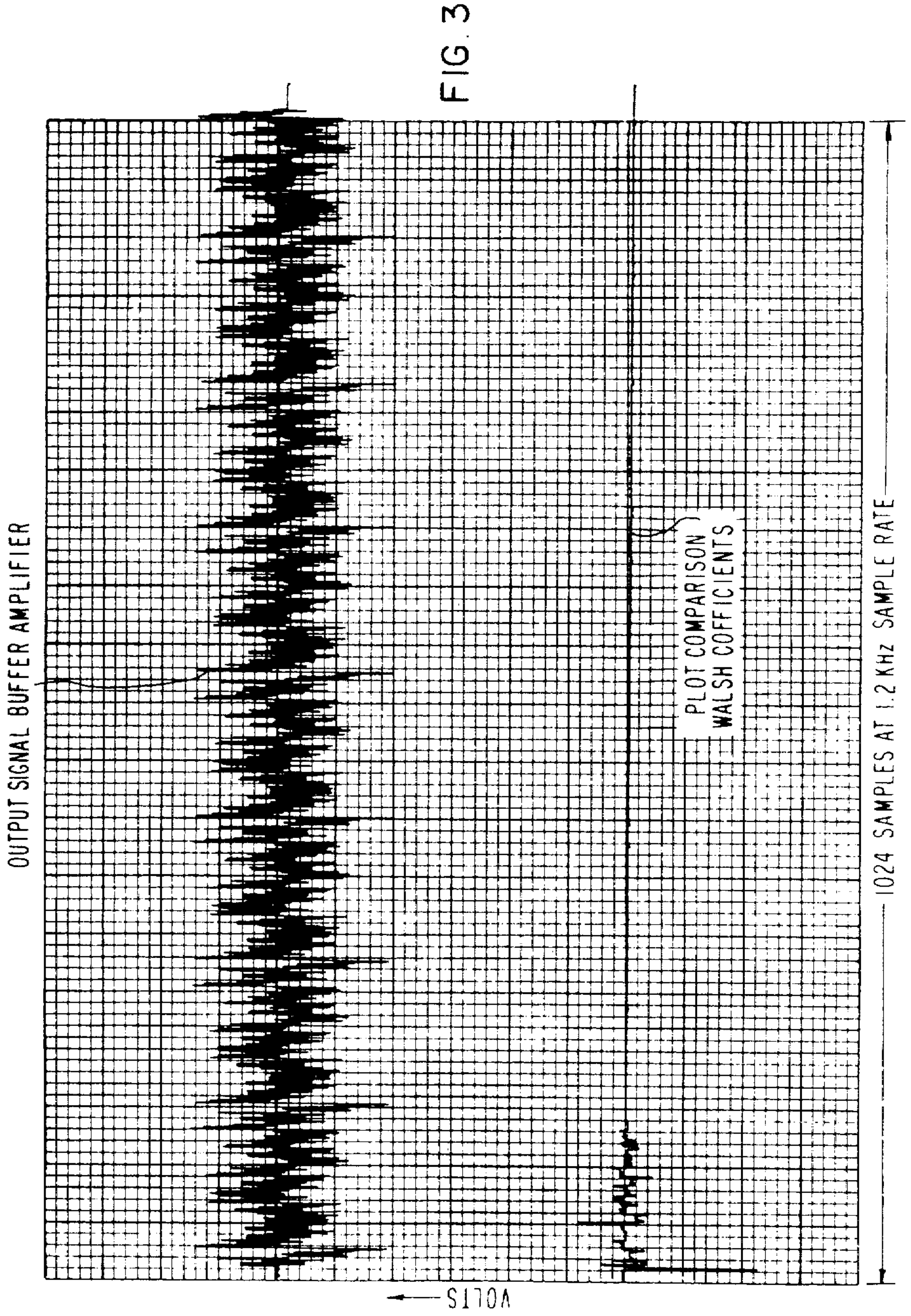
FIG. 3 is an analog plot of the digital data base generated by electrical apparatus to be tested when an error was introduced and an analog plot of the resulting Walsh Transform.

A second programmed logic aray, (type PAL 16R6), was deliberately programmed to introduce an error. A comparison data base was collected, converted to analog form and plotted in line 1 of FIG. 3. The comparison data base was processed to produce the comparison Walsh transform coefficients which are labeled and plotted in analog of FIG. 3.

Figure 2:
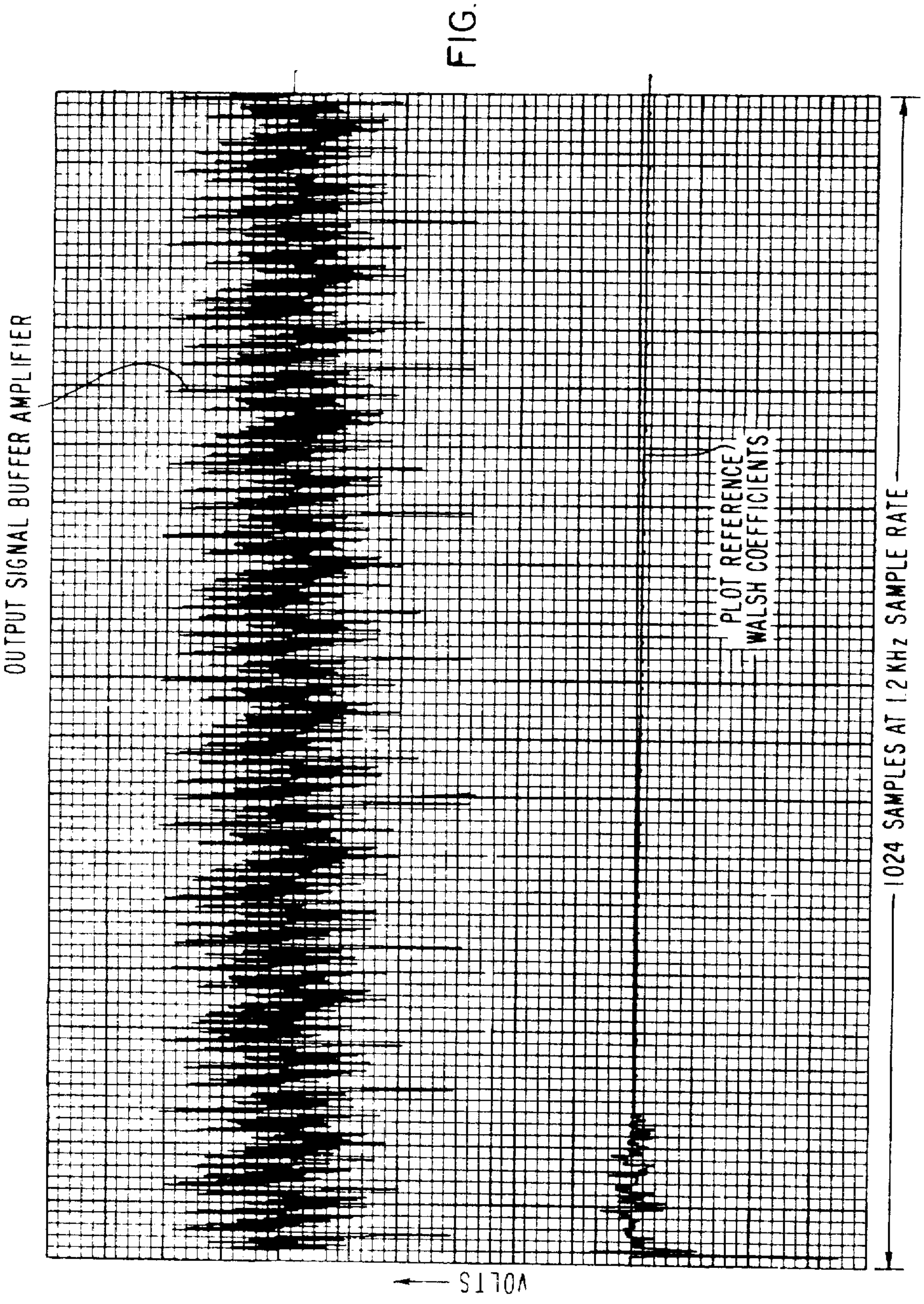
FIG. 2 is an analog plot of the digital data base generated by electrical apparatus to be tested under normal (known) operating condition and an analog plot of the resulting Walsh Transform coefficients.
Figure 5:
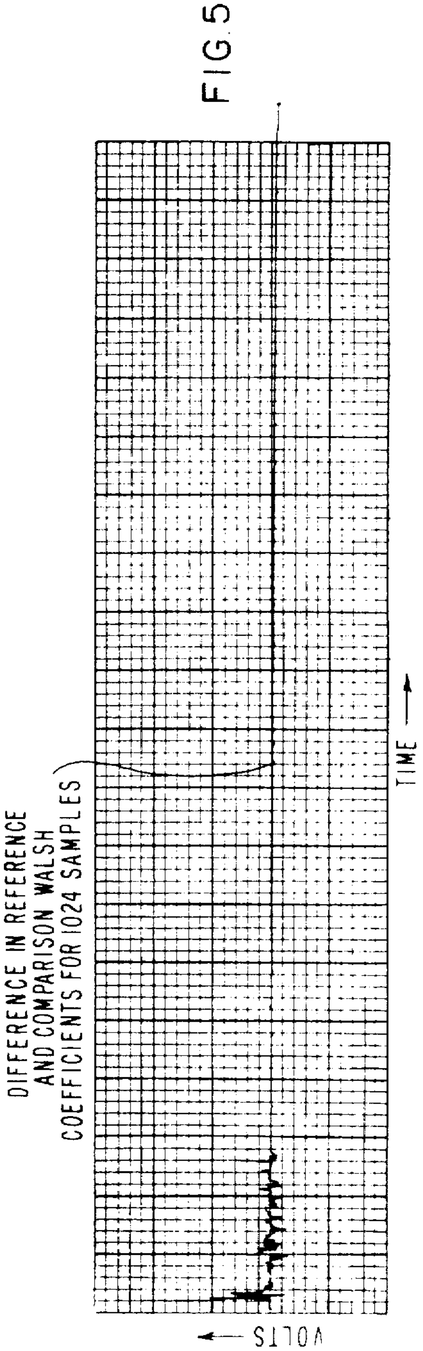
FIG. 5 is an analog plot of the difference between the Walsh Transform coefficients illustrated in FIGS. 2 and 3.

The reference Walsh Transform illustrated in FIG. 2 are subtracted from the comparison Walsh transform associated of the erroneously programmed array to generate the difference signal which is labeled and plotted in FIG. 5. The fact that there is significant difference between these two Walsh Transforms as illustrated in FIG. 5 which have non-zero values indicates that the deliberately introduced error can be detected using the disclosed test system and test methods. A threshold is experimentally placed on this difference to avoid normal variations from being interpreted as a malfunction.

Figure 4:
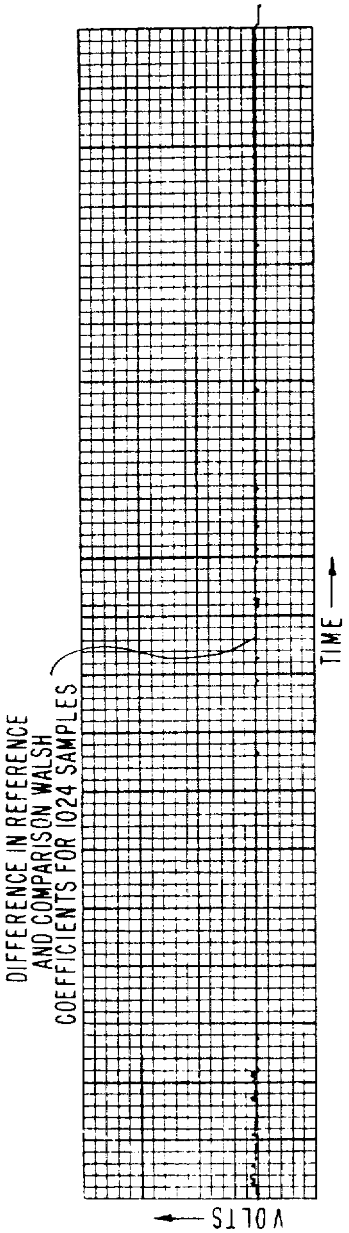
FIG. 4 is an analog plot of difference between the Walsh Transform coefficients illustrated in FIG. 2 and the Walsh coefficients transform of second electrical apparatus of the same design when both are operating correctly.

The basic technique utilized by the system to determine the current operational status of electrical apparatus is to compare the reference Walsh Transform coefficients to the comparison Walsh Transform coefficients. To illustrate that the threshold selected permitted differentiation between functional errors and normal variations between circuits of the same type, the reference Walsh Transform coefficients indicated in FIG. 2 were subtracted from the comparison Walsh Transforms coefficients of another identically programmed PAL16R6 with the resulting difference plotted in FIG. 4. As can be seen, the two transforms were essentially identical, indicating that the operating status of the second PAL16R6 is acceptable and that normal variations could be distinguished from errors.

No experimental or theoretical analysis has been made to establish the extent that the signal detected by the probe 30 must change in order for the associated error to be detectable using this technique. However, the above example illustrates that the system and techniques are adequate for detecting malfunctions in digital systems.

Figure 6:
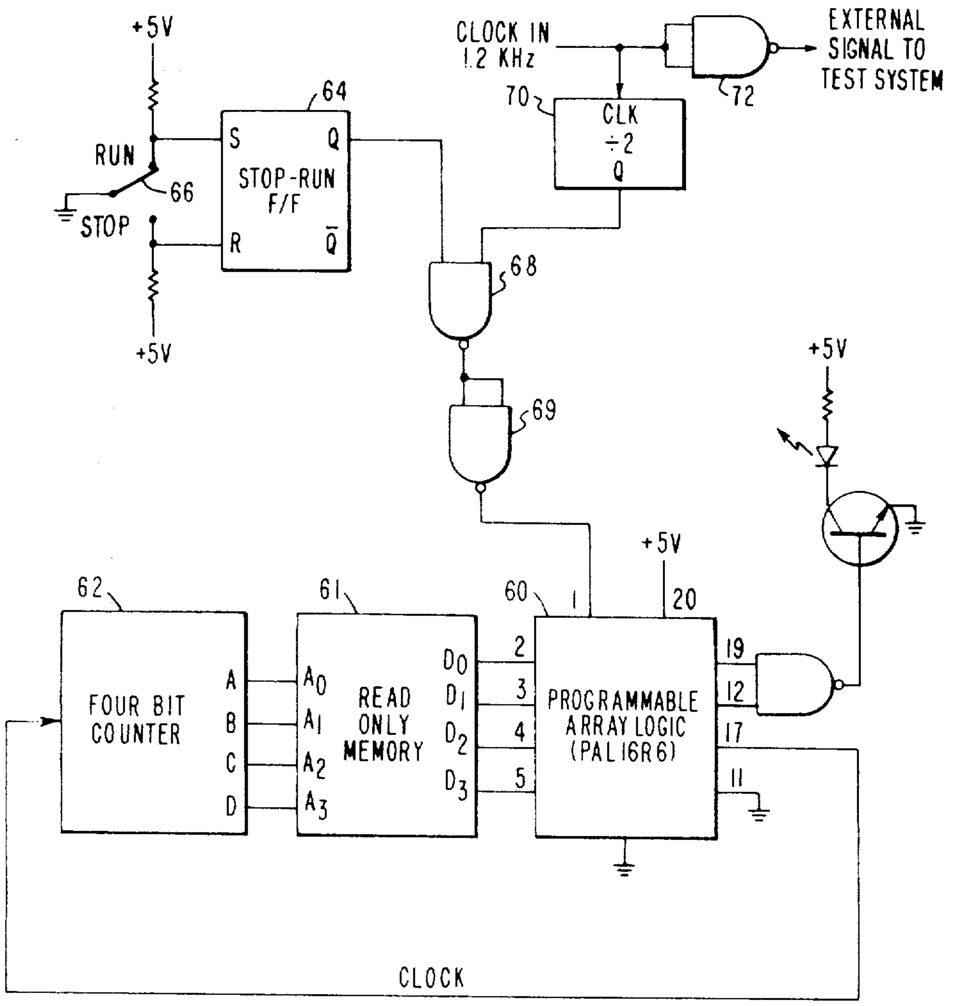
FIG. 6 is a logic diagram of the electrical apparatus utilized to generate the signals illustrated in FIGS. 2 and 3.

FIG. 6 is a logic diagram of the circuit actually used to generate the reference and comparison data bases discussed above. This circuit is included to permit the experimental results previously discussed to be verified. As previously discussed, the circuit tested was a programmable logic array, (type number PAL16R6 manufactured by Monolithic Memories and illustrated in FIG. 9) illustrated at reference numeral 60. The actual pin numbers of the programmable logic array are used to identify the inputs and outputs. Data inputs to the programmable logic array 60 is provided by a read only memory 61. Addresses to read data from the read only memory 61 are provided by a 4-bit binary counter 62. A clock signal to step the 4-bit binary counter 62 is provided by an output signal from the programmable logic array 60.

Only sixteen storage locations in the read only memory 61 are used. Sixteen sequential address numbers are generated by the four bit binary counter 62. In response to these addresses the following sequential data words are read from the read only memory 61.

| Address | Data |
|---|---|
| 0 | 0000 |
| 1 | 1101 |
| 2 | 0100 |
| 3 | 0001 |
| 4 | 1000 |
| 5 | 0010 |
| 6 | 1011 |
| 7 | 0101 |
| 8 | 0011 |
| 9 | 1111 |
| 10 | 1001 |
| 11 | 1100 |
| 12 | 0110 |
| 13 | 1010 |
| 14 | 0111 |

-continued

| Address | Data |
|---|---|
| 15 | 1110 |

The operation of the circuit is controlled by a stop-run flip-flop 64 which is set to either the stop or run position by a toggle switch 66. When the run signal is high, a gate 68 is enabled to couple a clock signal through a buffer 69 to the clock input terminal of the programmed logic array 60. The divide-by-two counter 70 is incremented by a clock signal which is also coupled through a buffer gate 72 to the test system to coordinate the collection of data.

Figure 10A:
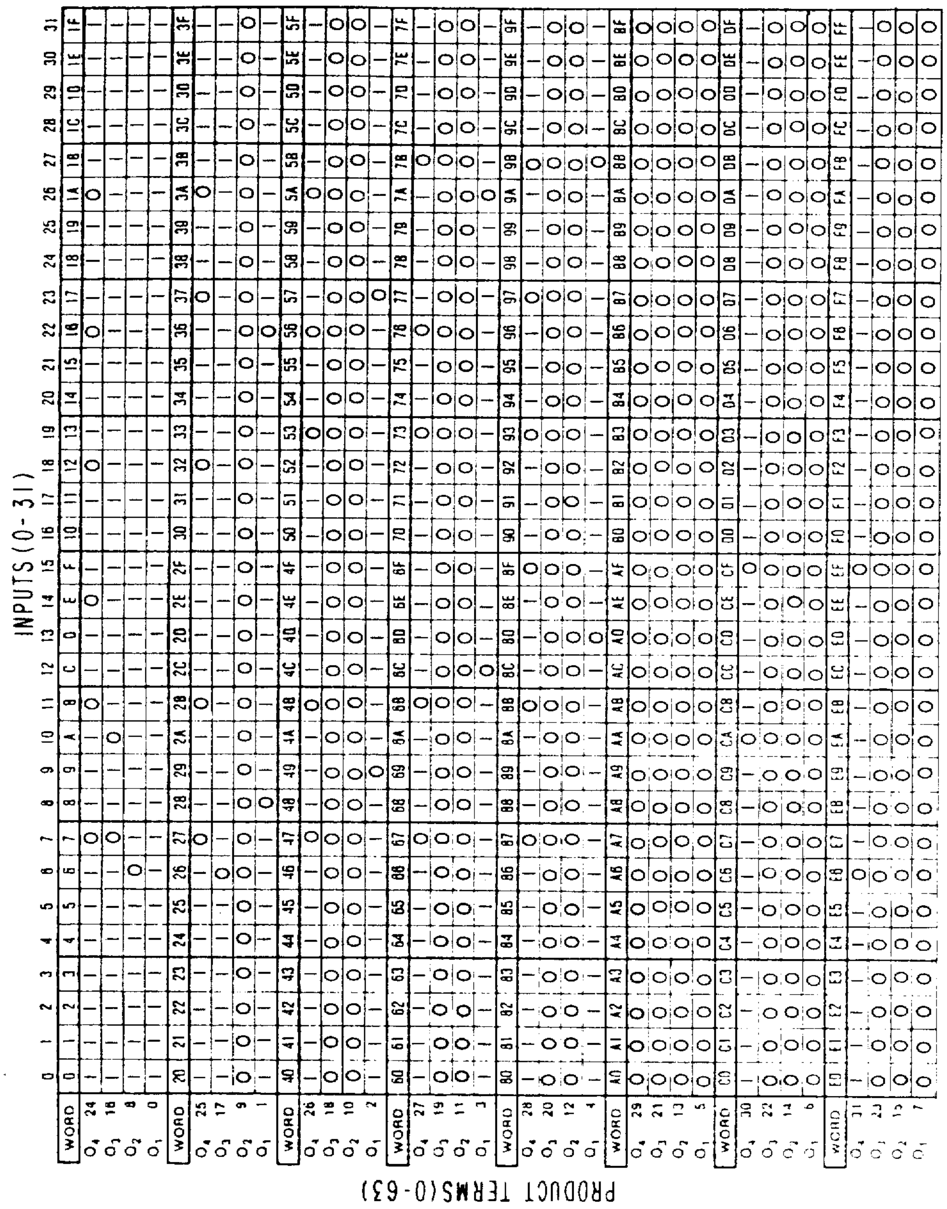
FIGS. 10A, 10B, 11A and 11B are programming charts for the programmable array logic circuit illustrated in FIG. 9.
Figure 10B:
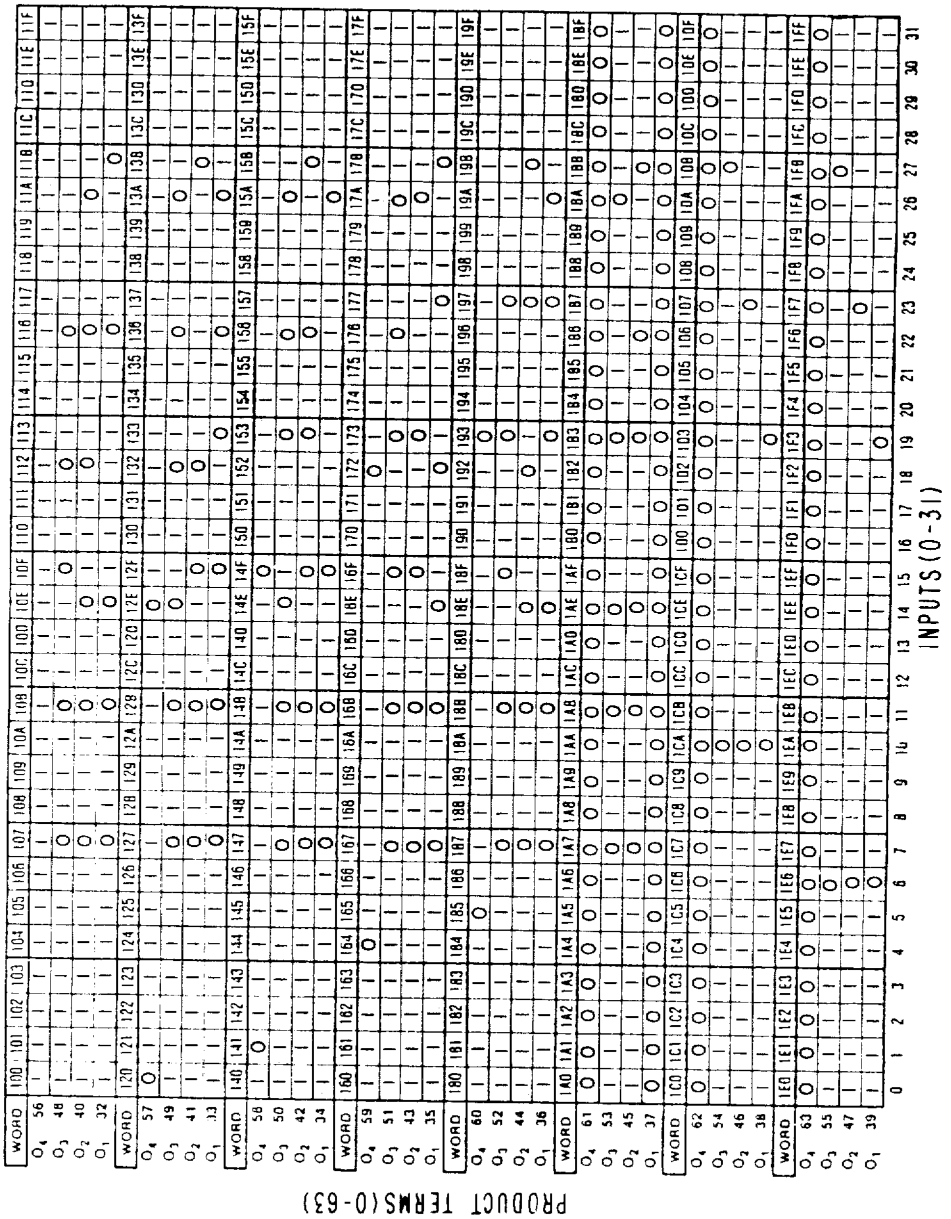
Figure 11A:
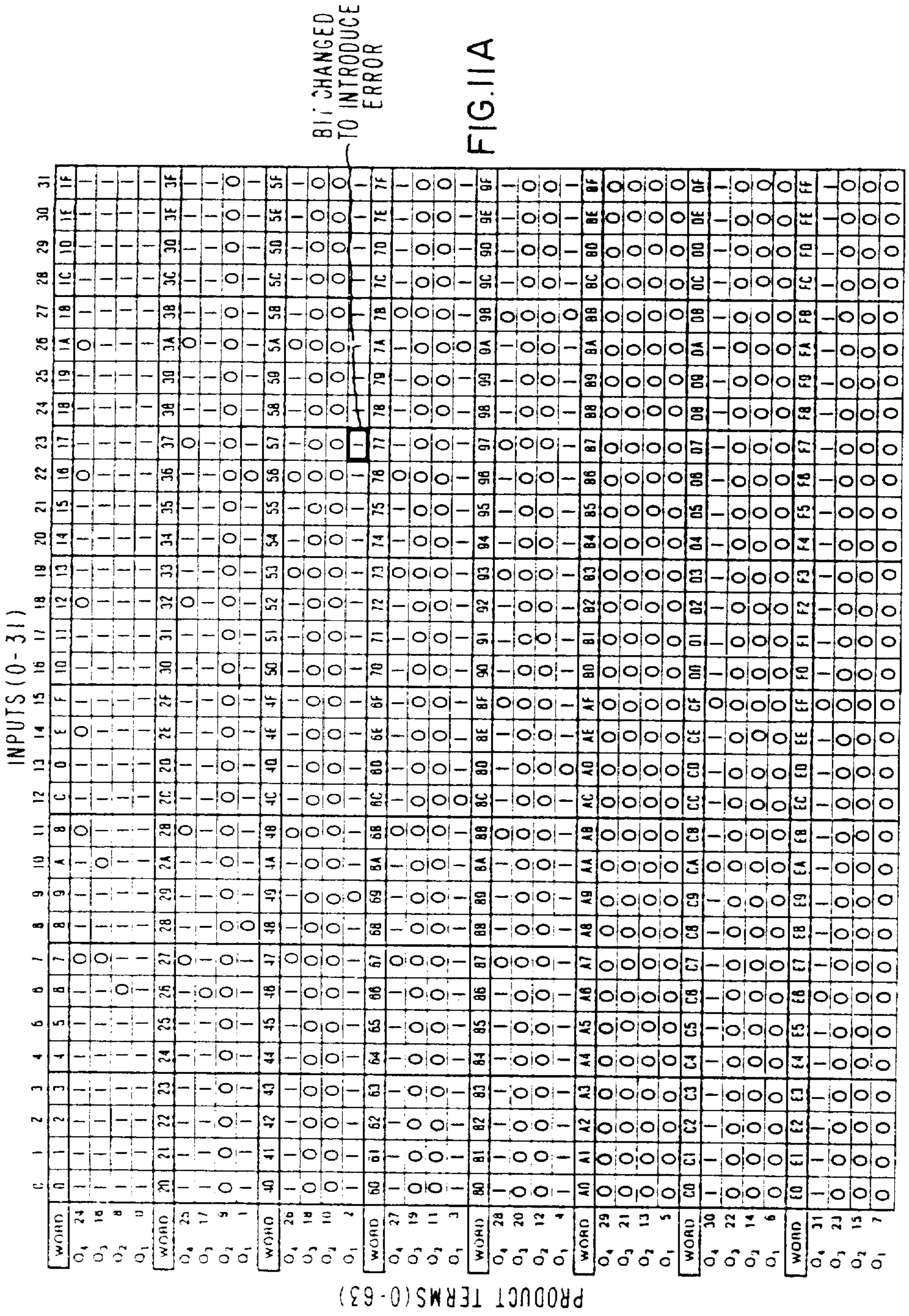
Figure 11B:
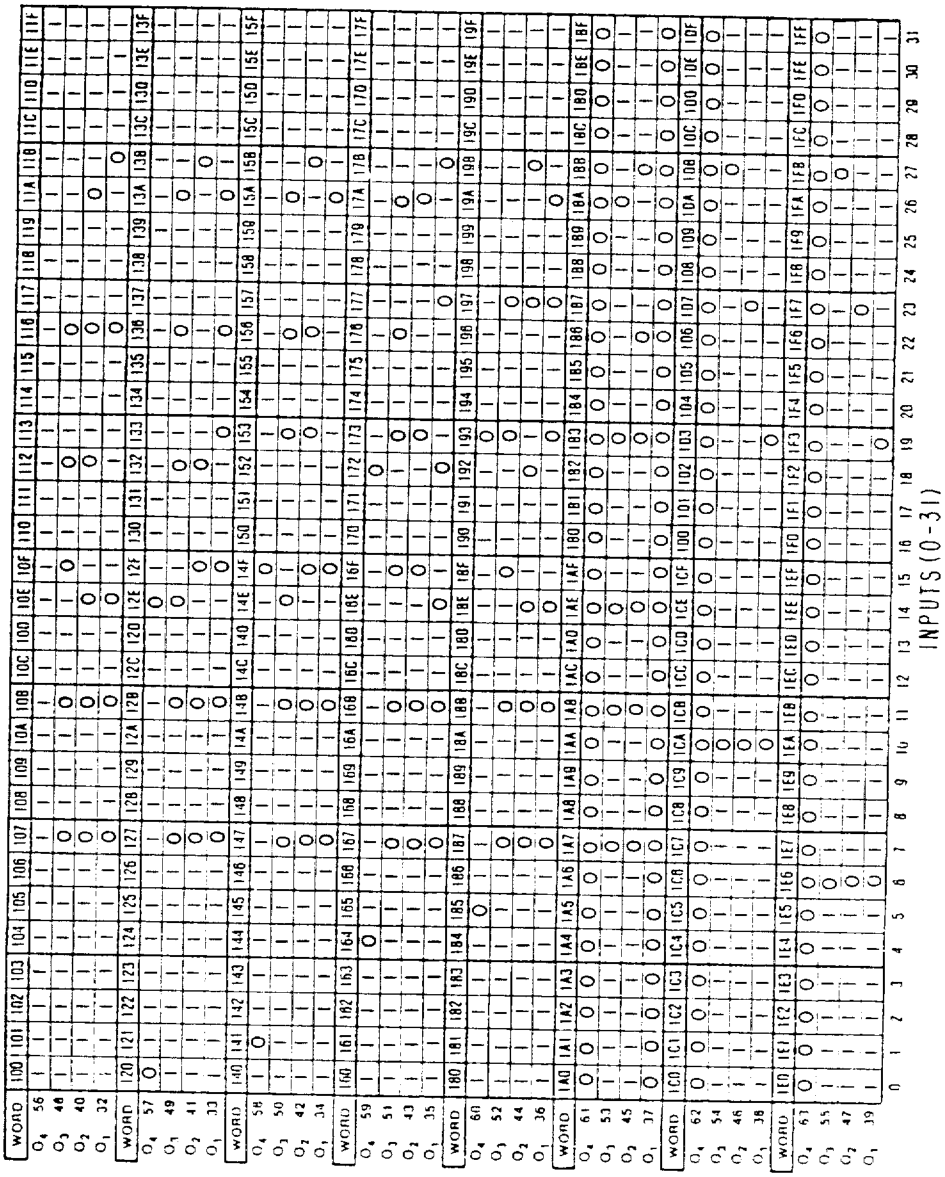

In the previous discussion illustrating the operation of the test system, the test probe 30 was positioned on the programmed logic array 60 to collect a set of reference data as previously described. This data is used as the reference data base as previously described. Then a second programmed logic array of the same type was programmed but an error was intentionally introduced by changing one bit in the program. A second data base was collected and used as the comparison data base. The comparison Walsh Transform coefficients of the reference and comparison data bases were compared to detect the deliberately introduced program error with the result of the comparison plotted in FIG. 5. The PAL program to generate the reference data base is illustrated in FIGS. 10A and 10B and the single bit changed to intentionally introduce the error is illustrated in FIGS. 11A and 11B with the bit changed being product term 2 and input 23.

Figure 9:
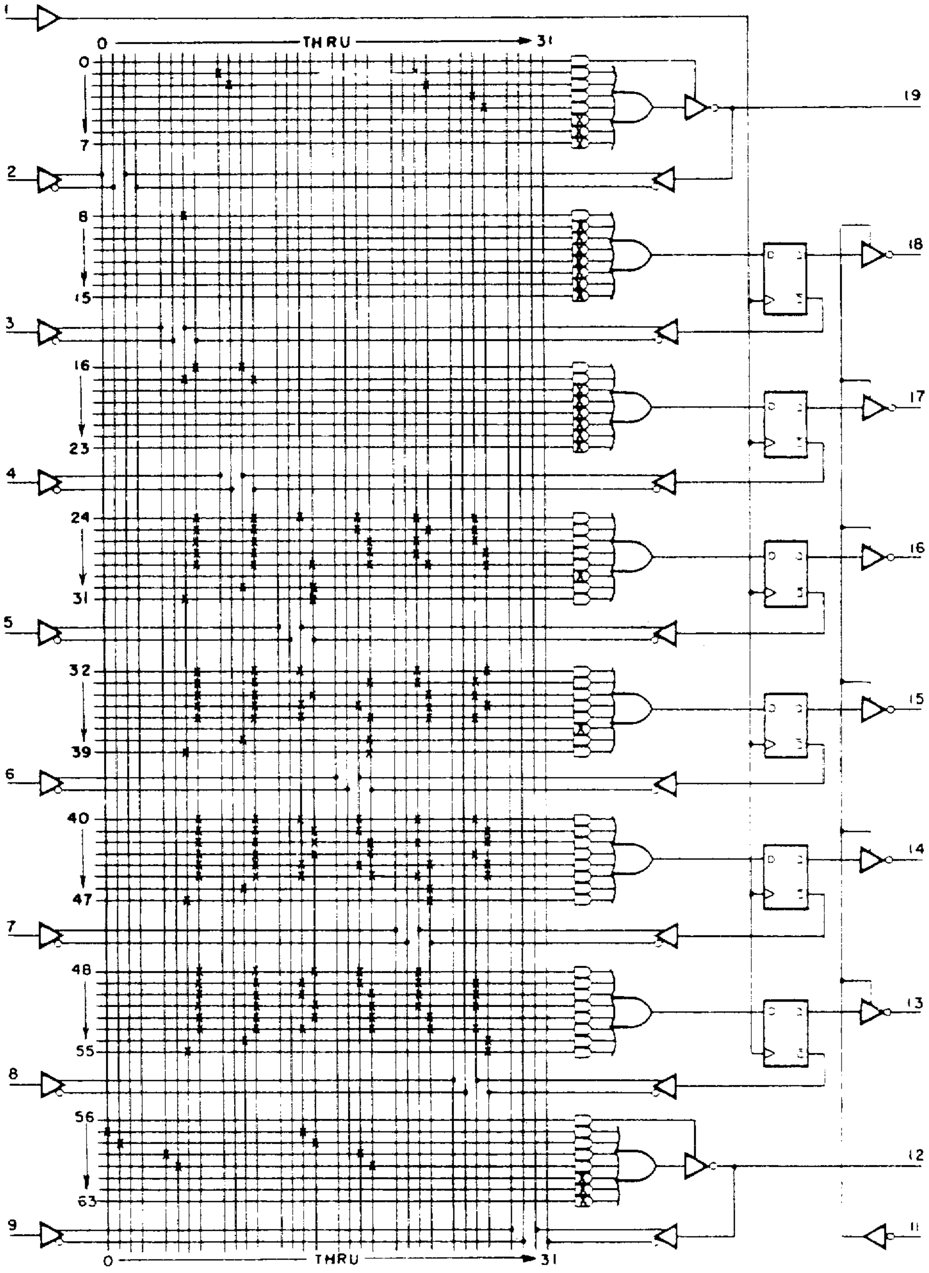
FIG. 9 is a diagram of a commercially available programmable array logic circuit.

The circuit illustrated in FIG. 6 including the program for the programmed logic array is part of a larger system being currently developed by the inventor. This circuit was used as a convenient technique to illustrate the operation of the invention without comprising a part thereof. The above illustration shows that changes in the operation of a complex digital circuit can be conveniently detected. Illustrating this capability does not require any discussion of the ultimate purpose of the circuit illustrated in FIG. 6. No detailed description of the PAL circuit illustrated in FIG. 9 is included because this is a standard commercially available circuit.

Figure 7:
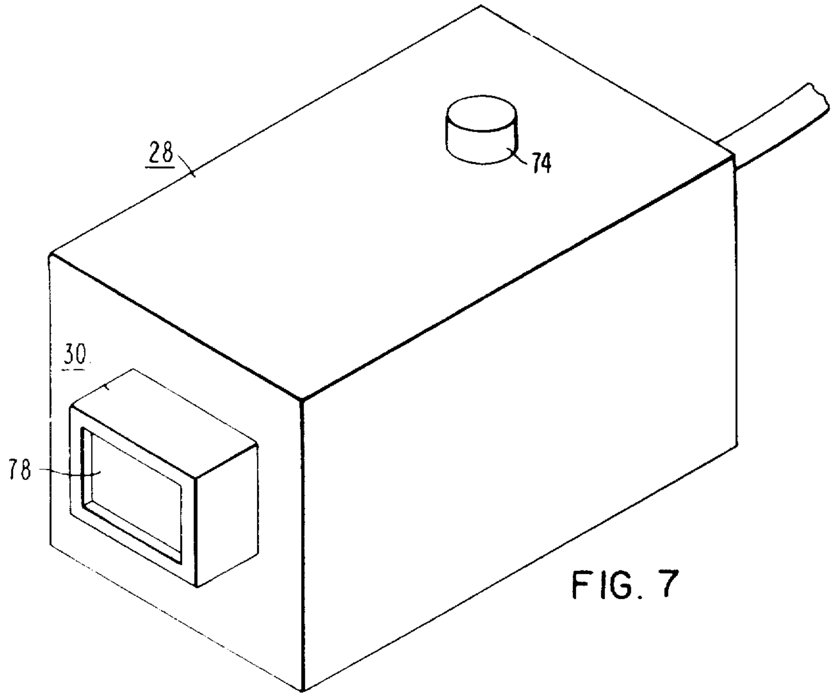
FIG. 7 is an isometric view of the test probe used in the system.

FIG. 7 is an isometric diagram of the probe 30 and the sample and hold amplifier 28 as assembled in a housing. The manual start button 74 is positioned in one surface of the sample and hold amplifier cabinet and is used to initiate the collection of data as previously discussed. Mounting the sample and hold amplifier 28 directly adjacent the probe as illustrated in FIG. 7 is advantageous in that the input impedance to the probe is very high, making it susceptible to noise. Therefore, it is necessary to mount the sample and hold amplifier 28 near the probe 30.

Figure 8:
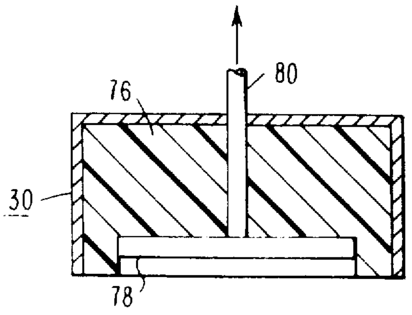
FIG. 8 is a partial cross section view of the test probe.

FIG. 8 is a cross section of the probe 30. The main body 76 is Micarta with a recess machined in one surface thereof. At the bottom of the recess is an electrically conductive plate 78. This plate is substantially the same size as the top surface of the programmed logic array previously discussed and the recess permits the electrode 78 to be positioned directly above the upper surface of the programmed logic array. The electrode 78 is coupled to the sample and hold amplifier 28 by a lead 80. Other types of probes may be used to generate a composite signal indicative of the operational status of the device to be tested.

Mechanically the electrode 78 can be affixed to the Micarta body 76 using any convenient means. Similarly the probe 30 can be affixed to the cabinet of the sample and hold amplifier 28 using conventional techniques.

As previously discussed the data is processed by a microprocessor 20. In the experimental model, the microprocessor 20 was an Intel 80-20 and was programmed in assembly language. The other components of the system can be implemented using prior art components and techniques. Therefore, the design details are not included for convenience of illustration. The actual program utilized by the experimental system is affixed hereto as Appendix A and presented in microfiche form.

The program consists of four major parts. The initialization routine is automatically entered upon power up. This routine causes the microprocessor 20 to configure selected control registers to initialize and clear various status and memory values.

Upon completion of the initialization routine, the microprocessor 20 enters the executive program loop. This program consists of a repeated loop on which various flags are tested, which indicate which function should next be performed. If a flag is asserted, control will pass to the appropriate subroutine which will provide the necessary service. Control will return to the executive loop once the service subroutine completes, and the microprocessor 20 will continue scanning the flags until another service is required.

The two major service routines involved are the data collection and Walsh Transformation routine, and the comparison routine. The collection routine will copy the external memory's contents into the microprocessor 20 (1024 values) and calculate the associated Fast Walsh Transform. Certain coefficients are filtered out, specifically the DC term, and the resultant coefficients are either stored as the reference array (if in reference mode) or will be stored as the comparison array (if in the comparison mode).

In the comparison routine, two types of operations are performed. First, the "city-block" distance between the reference array vector and the vector is calculated. If this distance is greater than a fixed limit (determined empirically), it is assumed the current data does not adequately compare to the reference data, and hence, the device under test is faulty. By making this fixed limit a finite, small value, normal variations between known good devices will be accepted by the test system. The second portion of the comparison routine involves an algorithm for determining if specific signals were present in the input signal. This is accomplished via a matched filter in the Walsh domain. In particular, four filters are implemented. These have been used in another experiment (not the experiment as described herein), and is used only to obtain further diagnostic information about the device under test.

Obviously, many modifications of the disclosed invention are possible, for example, the system is not limited to testing of integrated circuits. Any circuit which can be coupled via a probe to generate at the input of the analog-to-digital converter a suitable signal can be tested. Comparison techniques other than the "city block" comparison may be usable.

```
LOC  OBJ          SEQ    SOURCE STATEMENT      MASI VER.---FWHT PROGRAM

                                  TITLE  'MASI VER.---FWHT PROGRAM'
                                  NAME   MFWHT
                                  NLIST  M
                                  LIST   NX
                         ;
                         ;
                         ;
                                  ************************************************
                                  *                                              *
                                  *     FAST WALSH HADAMARD TRANSFORM -- FACTD   *
                                  *                                              *
                                  ************************************************
                         ;
                         ;
                                  DISC FILE NAME IS MFWHT.EXT     (MAC,OBJ,LST,MAP,SAV)
                         ;
                         ;
                                  ************************************************
                                  *                                              *
                                  *     MODIFIED VERSION OF THE FWHT PROGRAM     *
                                  *                                              *
                                  *     WILL CHECK STATUS FLAG ON SPC 008        *
                                  *                                              *
                                  ************************************************
                         ;
                         ;
                         ;        *       THIS PROGRAM IS SIMILAR TO FWHT, EXCEPT THAT IT WILL
                         ;        *       TEST THE SIGN BIT OF INPUT #20 H. IF THE SIGN IS
                         ;        *       POSITIVE (BIT 7 = '0'), THEN THIS PROGRAM WILL OPERATE AS THE
                         ;        *       OLD FWHT PROGRAM DID. IF THE SIGN IS NEGATIVE (BIT 7 = '1'),
                         ;        *       THE PROGRAM WILL CALL MGEN SUB (IN FROM #2) WHICH WILL ZERO THE
                         ;        *       FIRST SEQUENCY TERM AND THEN DETERMINE THE MASK AND THE SUM
                         ;        *       OF MASK & MASK BAR SQUARES. THESE VALUES ARE OUTPUTTED BY THE
                         ;        *       SUB TO OUTPUT #20,21 H. (THIS EXPLANATION ASSUMED THE SWITCHES WERE
                         ;        *       IN THE FWHT, CURRENT DATA MODES). IF THE SWITCHES ARE IN THE
                         ;        *       FWHT, DIFFERENCE MODE, THE SUM OF MASK & MASK BAR SQUARES WILL
                         ;        *       BE CALCULATED AND OUTPUTTED AS ABOVE.
                         ;
                         ;        *       REFER TO THE UMASI PROGRAM LISTING
                         ;
                         ;
                         ;
                         ;
                         ;THIS PROGRAM PERFORMS A FAST WALSH HADAMARD TRANSFORM AND RELATED
                         ;FUNCTIONS FOR USE ON THE FACTD PROJECT. THE TRANSFORM GENERATES THE
                         ;WALSH COEFFICIENTS IN NATURAL ORDER (AS OPPOSED TO SEQUENCY ORDERING).
                         ;
                         ;THE PROGRAM CONSISTS OF A MAIN EXECUTIVE LOOP. THE VARIOUS FUNCTIONS
                         ;ARE CALLED VIA SUBROUTINES AND MACROS.
                         ;
                         ;THIS PROGRAM IS INTENDED TO BE RUN ON THE INTEL 80/05 MICRO-
                         ;COMPUTER. THE TRANSFORM REQUIRES 8K OF RAM PLUS SOME SCRATCH-
                         ;PAD MEMORY.
                         ;        FACTD PROJECT    JUNE 12, 1981
                         ;
                         ;
                                  DSEG
                         ;
                         ;DATA SEGMENT ASSIGNMENTS
                         ;
                         ;ALL DATA RESIDES IN THE 16K RAM BOARD, EXCEPT FOR THE STACK, WHICH
                         ;USES THE 512 BYTE ON BOARD RAM OF THE 80/05.
                         ;
0000                     REF      DS      400H     ;REFERENCE ARRAY
                                                   ;EITHER A SET OF REAL-TIME DATA OR A FWHT COEFF
                                                   ;ARE STORED HERE FOR FUTURE COMPARISONS
0400                     DISP     DS      400H     ;DISPLAY ARRAY
                                                   ;THE CONTENTS OF THIS ARRAY ARE DUMPED TO THE
                                                   ;X-Y PLOTTER WHEN THE DISPLAY COMMAND IS
                                                   ;GIVEN
0800                     X        DS      800H     ;X ARRAY
                                                   ;DATA TO BE OPERATED UPON IN THE FWHT ROUTINE
                                                   ;FOR EACH ITERATION
1000                     Y        DS      800H     ;Y ARRAY
                                                   ;RESULTS OF THE CALCULATIONS IN EACH FWHT
                                                   ;ITERATION AND THE FINAL COEFFICIENTS
                         ;
                         ;THE DATA COLLECTION BUFFER IS A 1K X 8 BIT MEMORY IN THE DATA COLLECTIO
                         ;HARDWARE INTO WHICH THE RAW DATA SAMPLES ARE INITIALLY STORED. IT CAN B
                         ;READ BY THE INTEL 80/05 BY USE OF THE 01 PORT. THE INTEL 80/05 MUST
                         ;TOGGLE THE SOD (SERIAL OUTPUT DATA) LINE TO ADVANCE THE BINARY COUNTERS
                         ;WHICH OPERATE THE DATA COLLECTION BUFFER MEMORY'S ADDRESS LINES.
                         ;
                         ;THE FOLLOWING VARIABLES ARE USED IN THE FWHT ROUTINE.
                         ;
0400                     NOD      EQU     1024D    ;NUMBER OF DATA POINTS TO BE TRANSFORMED
1000   00 00             ITERN    DW      0        ;ITERATION COUNTER
1002   00 00             NUMP     DW      0        ;NUMBER OF PARTITIONS IN CURRENT ITERATION
1004   00 00             NUMEL    DW      0        ;NUMBER OF ELEMENTS PER PARTITION
1006   00 00             NUMEL2   DW      0        ;NUMBER OF ELEMENTS PER PARTITION WHICH
                                                   ;HAVE THE SAME OPERAND SIGN
1008   00 00             PNUM     DW      0        ;PARTITION NUMBER COUNTER
100A   00 00             POFF     DW      0        ;OFFSET TO THE FIRST ELEMENT IN A PARTITION
100C   00 00             PINDEX   DW      0        ;INDEX COUNTER THRU ONE-HALF OF A PARTITION
100E   00 00             SPTR     DW      0        ;PARTION ELEMENT POINTER FOR SUBTRACTIONS
1010   00 00             APTR     DW      0        ;PARTITION ELEMENT POINTER FOR ADDITIONS
1012   00 00             XAPTR    DW      0        ;ADDRESS OF X(APTR)
1014   00 00             XSPTR    DW      0        ;ADDRESS OF X(SPTR)
0A00              D      XMID     EQU     X+1024D  ;ADDRESS OF MIDDLE OF X ARRAY
1400              D      YMID     EQU     Y+1024D  ;ADDRESS OF MIDDLE OF Y ARRAY
                         ;
                         ;THE FOLLOWING VARIABLES ARE USED IN OTHER ROUTINES IN THE PROGRAM.
                         ;
1016   00                STATUS   DB      0        ;STATUS WORD
```

```
                                          ;OUTPUTTED VIA PORT 03 TO LED'S
1817  00 00         ARG1    DW     0      ;ARGUMENT 1 FOR DOUBLE PRECISION MATH
                                          ;RESULT RETURNED IN ARG 1
1819  00 00         ARG2    DW     0      ;ARGUMENT 2 FOR DOUBLE PRECISION MATH
181B  00 00         TEMP    DW     0      ;TEMPORARY STORAGE WORD
0800                ADCH    EQU    0800H  ;ADC H SUB ADDRESS (FROM 0)
0A00                MDAT    EQU    0A00H  ;MDAT SUB ADDRESS (FROM 0)

                            ASEG
                            ORG 0000H
0000  C3 5C 00   C  PWRUP:  JMP START     ;ON POWER UP, RESTART
                                          ;JUMP TO BEGINNING OF PROGRAM

                            ORG 0024H
0024  C3 5C 00   C  TRAP:   JMP START     ;JUMP TO BEGINNING OF PROGRAM

                            ORG 003CH
                    INTR75:               ;INTERRUPT 7.5 SERVICE ROUTINE
                                          ;RST7.5 = TIMER OUTPUT INTERRUPT.
                                          ;AT TERMINAL COUNT, OFH IS STORED
                                          ;IN REG B, WHICH IS PASSED TO THE MAIN
                                          ;PROGRAM. MAIN PROGRAM DOES NOT USE REG B
                                          ;WHEN THE TIMER INTERRUPTS ARE ENABLED.
                                          ;PROGRAM WILL CHECK REG B, AND WILL CLEAR
                                          ;IT WHILE RESPONDING TO THE INTERRUPT.
003C  06 0F                MVI B,0FH     ;PUT 0FH INTO REG B
003E  3E 18                 MVI A,00011011B ;SIM INSTRUCTION MASK
0040  30                    SIM           ;RESET RST7.5 FLIP-FLOP
0041  FB                    EI            ;ENABLE INTERRUPTS
0042  C9                    RET           ;DONE

                            ORG 0060H
0060  00 18      D  LIMIT   DW     Y+2048 ;END OF ARRAY RAM AREA
0062  0A 00         ITER    DW     10D    ;NUMBER OF ITERATIONS
                                          ;(= LOG2 NUM)
0064  00 08      D  DEND    DW     DISP+1024D
                                          ;END OF DISPLAY RAM
0066  08 00         RFCON   DW     8D     ;ITERATION COUNT AT WHICH VALUES MUST BE SCALED
                            CSEG
                    ;
                    ;MACRO DEFINITIONS AND SUBROUTINES.
                    ;

                    AINDX   MACRO INDX,ARRNM
                                          ;MACRO TO CALCULATE THE ADDRESS
                                          ;OF A SPECIFIC ARRAY ELEMENT (INDX)
                                          ;IN THE DESIRED ARRAY (ARRNM)
                                          ;(ARRNM(INDX)=ARRNM + 4*INDX)
                                          ;INDX=ADDR OF MEMORY LOC OF INDEX VALUE
                                          ;ARRNM=ADDR OF THE FIRST ELEMENT IN THE ARRAY
                            LHLD INDX     ;GET INDEX VALUE
                            XCHG          ;PUT INTO DE REG
                            LXI H,ARRNM   ;GET ARRAY ADDRESS
                            DAD D         ;ADD INDEX TO ARRAY ADDRESS
                                          ;RESULT NOW IN HL REG
                            ENDM

                    ARRXF   MACRO  SRC,SRCCT,DST,DSTCT,SUBT
                            LOCAL XFRLP,PDST,NEAC
                                          ;MACRO TO TRANSFER AN ARRAY OF 1024
                                          ;ELEMENTS TO ANOTHER ARRAY.
                                          ;SRC=SOURCE ARRAY NAME
                                          ;     (NULL=DATA COLL BUFFER)
                                          ;SRCCT=# OF BYTES PER SOURCE WORD
                                          ;     (NULL IF SRC IS NULL)
                                          ;DST=DESTINATION ARRAY NAME
                                          ;DSTCT=# OF BYTES PER DEST WORD
                                          ;SUBT= 0 IF A DIRECT TRANSFER DESIRED
                                          ;      1 IF SOURCE FFT ARRAY
                                          ;      IS TO BE STORED IN DEST
                            MVI A,40H     ;SIM INSTRUCTION MASK
                            SIM           ;OUTPUT A ZERO ON SOD LINE
                            LXI B,0       ;CLEAR THE LOOP COUNTER
                            LXI H,DST     ;HL POINTS TO THE CURRENT DEST BYTE
                            IF NARG 3
                                          ;IF THREE ARGUMENTS, THEN DATA
                                          ;COLL BUFFER IS THE SOURCE.
                                          ;IF FIVE ARGS, THEN DO
                            LXI D,SRC     ;DE POINTS TO THE CURRENT SOURCE BYTE
                            ENDIF
                    XFRLP:  NOP
```

```
                                IF NARGS 3
                                                        ;IF NOT THREE ARGS, THEN INPUT A BYTE
                                                        ;FROM THE SOURCE ARRAY.
                                LDAX D                  ;INPUT NEXT DATA VALUE
                                INX D                   ;POINT TO NEXT BYTE
                                IF SRCCT=1
                                                        ;CHECK # OF BYTES PER WORD
                                INX D                   ;2 BYTES PER WORD
                                ENDIF
                                ELSE
                                IN 01                   ;INPUT DATA COLL BUFFER VALUE
                                PUSH PSW                ;SAVE ON STACK
                                MVI A,0C0H              ;SIM INSTRUCTION BASE
                                SIM                     ;OUTPUT A ONE ON THE SOD
                                MVI A,40H               ;SIM INSTRUCTION BASE
                                SIM                     ;OUTPUT A ZERO ON THE SOD
                                POP PSW                 ;RETREIVE THE DATA VALUE INTO ACC
                                ENDIF
                                                        ;
                                                        ;THE DESIRED SOURCE WORD IS NOW
                                                        ;IN THE ACCUMULATOR.
                                                        ;
                                IF SUBT
                                                        ;SUBTRACT REF(I) FROM THE ACC
                                                        ;AND RETURN THE ANSWER IN THE ACC.
                                CALL MSUB               ;ACC-REF(B,C)--->ACC
                                ENDIF
                                                        ;
                                                        ;NOW THE RESULT MUST BE SAVED IN
                                                        ;THE DEST ARRAY.
                                                        ;
                                MOV M,A                 ;SAVE RESULT IN DEST(I)
                                INX H                   ;INCRE DEST POINTER
                                IF DSTCT=1
                                ORI 00                  ;SET, CLEAR SIGN BIT
                                JP POSI                 ;JUMP IF POSITIVE
                                MVI A,0FFH              ;NEGATIVE VALUE SIGN EXTEND
                                JMP NEGC                ;CONTINUE
                        POSI:   MVI A,00                ;POSITIVE VALUE SIGN EXTEND
                        NEGC:   MOV M,A                 ;STORE MSB
                                INX H                   ;
                                ENDIF
                                                        ;
                                                        ;NOW INCREMENT LOOP COUNTER AND
                                                        ;CHECK IF ALL 1024 VALUES HAVE BEEN
                                                        ;TRANSFERRED.
                                                        ;
                                INX B                   ;INCRE LOOP COUNTER
                                MVI A,04H               ;IF B,C = 0400H, THEN DONE
                                CMP B                   ;DONE?
                                JNZ XFRLP               ;IF NOT, LOOP AGAIN
                                                        ;ELSE, ALL DONE
                                ENDM
                        MSUB:
                                                ;THIS SUB WILL SUBTRACT AN 8 BIT
                                                ;BYTE, IN 2'S COMPLEMENT, FROM ANOTHER
                                                ;8 BIT BYTE. IF OVERFLOW OCCURS, EITHER
                                                ;+127 OR -128 IS RETURNED, DEPENDING
                                                ;ON THE SIGN OF THE SOURCE ARGS
                                                ;OPERATION PERFORMED IS
                                                ;ACC-REF(B,C)--->ACC
                                                ;NOTE THAT ALL REGISTERS CONTAIN
                                                ;DATA INFO WHICH MUST BE PRESERVED.
                                                ;REG B,C CONTAINS THE REF ARRAY INDEX
       0000  E5                 PUSH H          ;SAVE H,L ON THE STACK
       0001  D5                 PUSH D          ;SAVE D,E ON THE STACK
       0002  [illegible]        MOV [illegible]
       0003  [illegible]        MO[illegible]   ;[illegible] ARRAY INDEX VALUE INTO [illegible]
       0004  [illegible]   D    [illegible]     ;[illegible]
       [illegible]              AINDX AFIP,REF  ;[illegible] ADDRESS IN H,L
       [illegible]              MOV [illegible] ;[illegible] VALUE
       [illegible]              MOV [illegible] ;SAVE A COPY OF THE ACC
       [illegible] AA           XRA D           ;SEE IF THE SIGN OF ARGS IS THE SAME
       0012  FA 1A 00      C    JM DFF          ;JUMP IF THEY ARE OPPOSITE
       0015  7B                 MOV A,E         ;PUT ARG INTO ACC
       0016  92                 SUB D           ;SUBTRACT REF(I) FROM ACC
       0017  C3 31 00      C    JMP ANSW        ;CORRECT ANSWER NOW IN ACC
       001A  7B         DFF:    MOV A,E         ;PUT ARG INTO ACC
       001B  E6 80              ANI 80H         ;TEST THE SIGN BIT
       001D  FA 2A 00      C    JM NEG          ;IF REF(I) IS NEG, JUMP
       0020  7B         POS:    MOV A,E         ;PUT ARG INTO ACC
       0021  92                 SUB D           ;SUBTRACT REF(I) FROM ACC
       0022  FA 31 00      C    JM ANSW         ;IF RESULT IS NEGATIVE, ANSWER IS
                                                ;CORRECT IN ACC, SO JUMP
       [illegible] 3E 80        MVI A,80H       ;ELSE, PUT -128 INTO ACC TO INDICATE
                                                ;OVERFLOW
       0027  C3 31 00      C    JMP ANSW        ;
       002A  7B         NEG:    MOV A,E         ;PUT ARG INTO ACC
       002B  92                 SUB D           ;SUBTRACT REF(I) FROM ACC
       002C  F2 31 00      C    JP ANSW         ;IF RESULT IS POSITIVE, ANSWER IS
                                                ;CORRECT IN ACC, SO JUMP
       002F  3E 7F              MVI A,7FH       ;ELSE, PUT +127 INTO ACC TO INDICATE
                                                ;OVERFLOW
       0031  D1         ANSW:   POP D           ;ANSWER NOW IN ACC
       0032  E1                 POP H           ;RETREIVE REG D,E & H,L
       0033  C9                 RET             ;
                        PMAC:   MACRO OPER[illegible]
                                                ;MACRO TO PERFORM DOUBLE PRECISION ADDITION
                                                ;AND SUBTRACTION TO SIGNED, 2'S COMPLEMENT
                                                ;WORDS. TWO BYTES PER WORD.
                                                ;OPER DETERMINES IF ADD OR SUB TO BE PERFORMED
                                                ;ARG1: LSB OF ARG 1
                                                ;ARG2: MSB OF ARG 1
                                                ;ARG3: LSB OF ARG 2
                                                ;ARG4: MSB OF ARG 2
                                                ;IF OPER = ADD [illegible]
```

```
                                        ;  ARG1+ARG2     ARG1
                                        ;IF OPERD = SBB M
                                        ;  ARG1-ARG2     ARG1
                          PUSH H        ;SAVE H,L ON STACK
                          PUSH B        ;SAVE B,C ON STACK
                          LXI B,ARG1    ;ADDR OF THE FIRST ARG
                          LXI H,ARG2    ;ADDR OF THE SECOND ARG
                          XRA A         ;CLEAR CARRY BIT
                          LDAX B        ;PUT ARG 1 LSB INTO ACC
                          OPERD         ;ADD OR SUB ARG 2 LSB
                          STAX B        ;STORE ANSWER IN ARG 1 LSB
                          INX B         ;POINT TO MSB
                          INX H         ;
                          LDAX B        ;PUT ARG 1 MSB INTO ACC
                          OPERD         ;ADD OR SUB ARG 2 MSB
                          STAX B        ;STORE ANSWER IN ARG 1 MSB
                                        ;NOTE --- NO OVERFLOW CHECKING IS DONE
                          POP B         ;RETREIVE REG B,C & H,L
                          POP H         ;
                          ENDM


                          LIST M
0034              FRADD:
                                        ;THIS SUB WILL PERFORM DOUBLE
                                        ;PRECISION ADDITION.
0034                      FMATH <ADC M>
                  +                     ;MACRO TO PERFORM DOUBLE PRECISION ADDITION
                  +                     ;AND SUBTRACTION TO SIGNED, 2'S COMPLEMENT
                  +                     ;WORDS. TWO BYTES PER WORD.
                  +                     ;OPERD DETERMINES IF ADD OR SUB TO BE PERFORMED
                  +                     ;ARG1=LSB OF ARG 1
                  +                     ;ARG1+1=MSB OF ARG 1
                  +                     ;ARG2=LSB OF ARG 2
                  +                     ;ARG2+1=MSB OF ARG 2
                  +                     ;IF OPERD = ADC M
                  +                     ;  ARG1+ARG2     ARG1
                  +                     ;IF OPERD = SBB M
                  +                     ;  ARG1-ARG2     ARG1
0034  E5          +       PUSH H        ;SAVE H,L ON STACK
0035  C5          +       PUSH B        ;SAVE B,C ON STACK
0036  01 17 18  D +       LXI B,ARG1    ;ADDR OF THE FIRST ARG
0039  21 19 18  D +       LXI H,ARG2    ;ADDR OF THE SECOND ARG
003C  AF          +       XRA A         ;CLEAR CARRY BIT
003D  0A          +       LDAX B        ;PUT ARG 1 LSB INTO ACC
003E  8E          +       ADC M         ;ADD OR SUB ARG 2 LSB
00??  0?          +       STAX B        ;STORE ANSWER IN ARG 1 LSB
00??  03          +       INX B         ;POINT TO MSB
0041  23          +       INX H         ;
004?  0A          +       LDAX B        ;PUT ARG 1 MSB INTO ACC
004?  8E          +       ADC M         ;ADD OR SUB ARG 2 MSB
004?  02          +       STAX B        ;STORE ANSWER IN ARG 1 MSB
                  +                     ;NOTE --- NO OVERFLOW CHECKING IS DONE
004?  C1          +       POP B         ;RETREIVE REG B,C & H,L
0042  E1          +       POP H         ;
004?  C9                  RET           ;


0048              FRSUB:
                                        ;THIS SUB WILL PERFORM DOUBLE
                                        ;PRECISION SUBTRACTION.
0048                      FMATH <SBB M>
                  +                     ;MACRO TO PERFORM DOUBLE PRECISION ADDITION
                  +                     ;AND SUBTRACTION TO SIGNED, 2'S COMPLEMENT
                  +                     ;WORDS. TWO BYTES PER WORD.
                  +                     ;OPERD DETERMINES IF ADD OR SUB TO BE PERFORMED
                  +                     ;ARG1=LSB OF ARG 1
                  +                     ;ARG1+1=MSB OF ARG 1
                  +                     ;ARG2=LSB OF ARG 2
                  +                     ;ARG2+1=MSB OF ARG 2
                  +                     ;IF OPERD = ADC M
                  +                     ;  ARG1+ARG2     ARG1
                  +                     ;IF OPERD = SBB M
                  +                     ;  ARG1-ARG2     ARG1
0048  E5          +       PUSH H        ;SAVE H,L ON STACK
0049  C5          +       PUSH B        ;SAVE B,C ON STACK
004A  01 17 18  D +       LXI B,ARG1    ;ADDR OF THE FIRST ARG
004D  21 19 18  D +       LXI H,ARG2    ;ADDR OF THE SECOND ARG
0050  AF          +       XRA A         ;CLEAR CARRY BIT
0051  0A          +       LDAX B        ;PUT ARG 1 LSB INTO ACC
0052  9E          +       SBB M         ;ADD OR SUB ARG 2 LSB
0053  02          +       STAX B        ;STORE ANSWER IN ARG 1 LSB
0054  03          +       INX B         ;POINT TO MSB
0055  23          +       INX H         ;
00??  0A          +       LDAX B        ;PUT ARG 1 MSB INTO ACC
00??  9E          +       SBB M         ;ADD OR SUB ARG 2 MSB
00??  02          +       STAX B        ;STORE ANSWER IN ARG 1 MSB
                  +                     ;NOTE --- NO OVERFLOW CHECKING IS DONE
0059  C1          +       POP B         ;RETREIVE REG B,C & H,L
005A  E1          +       POP H         ;
005B  C9                  RET           ;


                          NOLIST M
                  MOVE    MACRO WHERE
                                        ;MACRO TO MOVE TWO SEQUENTIAL BYTES,
                                        ;ADDRESSED BY H,L INTO WHERE AND
                                        ;WHERE+1
```

```
                          MOV A,M        ;PUT LSB INTO ACC
                          STA WHERE      ;STORE LSB IN WHERE
                          INX H          ;POINT TO NEXT BYTE
                          MOV A,M        ;PUT MSB INTO ACC
                          STA WHERE+1    ;STORE IN WHERE+1
                          ENDM

                MOVEM     MACRO FROM
                                         ;MACRO TO MOVE TWO SEQUENTIAL BYTES
                                         ;FROM AND FROM+1 TO M AND M+1
                                         ;REGISTERS H,L CONTAIN THE ADDRESS M
                          LDA FROM       ;PUT LSB INTO ACC
                          MOV M,A        ;STORE LSB AT M
                          INX H          ;NEXT BYTE
                          LDA FROM+1     ;PUT MSB INTO ACC
                          MOV M,A        ;STORE MSB AT M
                          ENDM
                HCMP      MACRO WHO
                          LOCAL NOTSM,SAME
                                         ;MACRO FOR COMPARING TWO 2 BYTE
                                         ;WORDS AND SETTING THE ZERO FLAG
                                         ;ACCORDINGLY. REGISTERS H,L ARE
                                         ;COMPARED TO THE CONTENTS OF WHO+1,WHO
                                         ;RESPECTIVELY.
                                         ;ZERO SET = WORDS ARE IDENTICAL
                                         ;ZERO CLEARED = WORDS ARE DIFFERENT
                          LDA WHO        ;PUT LSB INTO ACC
                          CMP L          ;COMPARE LSB'S
                          JNZ NOTSM      ;JUMP IF NOT THE SAME
                          LDA WHO+1      ;PUT MSB INTO ACC
                          CMP H          ;COMPARE MSB'S
                          JNZ NOTSM      ;JUMP IF NOT THE SAME
                SAME:     XRA A          ;SET ZERO FLAG
                NOTSM:    NOP            ;IF NOT SAME, ZERO FLAG WILL BE CLEARED
                          ENDM

                MAIN      CSEG F
                ;
                ;START AND INITIALIZATION ROUTINE
                ;
0050  F3        START:    DI             ;DISABLE INTERRUPTS
0050  31 FF 3E            LXI SP,3EFFH   ;INIT STACK POINTER TO TOP OF ON BOARD RAM
0060  3E 00               MVI A,0        ;CLEAR ACC
0062  32 16 1B  D         STA STATUS     ;CLEAR STATUS
0065  3E 4C               MVI A,01001100B ;USE WORD FOR I/O
                                         ;STOP THE TIMER
                                         ;DISABLE PORT INTERRUPTS
                                         ;PORT 01 = INPUT
                                         ;PORT 02 = INPUT
                                         ;PORT 03 = OUTPUT
0067  D3 00               OUT 00         ;OUTPUT I/O USE
0069  AF                  XRA A          ;CLEAR THE ACC
006A  D3 03               OUT 03         ;OUTPUT 00 TO STATUS OUTPUT
006C  21 00 00  D         LXI H,REF      ;ADDR OF BEGINNING OF ARRAYS
006F  36 00     CLRLP:    MVI M,0        ;CLEAR ARRAY ELEMENT
0071  23                  INX H          ;NEXT ARRAY ELEMENT
0072                      HCMP LIMIT     ;DONE?
0082  C2 6F 00  C         JNZ CLRLP      ;LOOP UNTIL DONE
                ;
                ;MAIN EXECUTIVE PROGRAM LOOP
                ;
0085  DB 02     EXEC:     IN 02          ;INPUT SWITCH INFO
0087  E6 08               ANI 08H        ;ANALYZE SWITCH PRESSED?
0089  CA [illegible]  C   JZ CLRAN       ;JUMP IF NOT
008C  3A 16 1B  D         LDA STATUS     ;IS ANALYSIS SWITCH STILL DEPRESSED
008F  [illegible]         [illegible]    ;FROM THE LAST ANALYSIS OR IS THIS A
                                         ;NEW ANALYSIS COMMAND?
0091  C2 [illegible] C    JNZ CHKDSP     ;IF STILL SET, THEN ANALYSIS WAS JUST
                                         ;COMPLETED OR LAST BUT SWITCH IS STILL
                                         ;DEPRESSED. IGNORE ANALYSIS COMMAND
[illegible]     DCO[illegible] IN [illegible] ;INPUT SWITCH INFO
[illegible]               ANI [illegible] ;[illegible]
[illegible]               JNZ DCO[illegible] ;LOOP UNTIL [illegible]
[illegible]               IN [illegible] ;INPUT SWITCH INFO
[illegible]               ANI 80[illegible] ;[illegible]
[illegible]               JN[illegible] ANA[illegible] ;[illegible]
[illegible]               [illegible]    ;[illegible]
[illegible]               [illegible] STATUS ;[illegible]
[illegible]               [illegible]    ;[illegible]
00A[illegible]            MOV M,A        ;SAVE STATUS
00A[illegible] D3 [illegible] OUT 03     ;OUTPUT NEW STATUS WORD
00AB  C3 85 00  C         JMP EXEC       ;LOOP FOREVER
00AE  CD CA 00  C ANALCT: CALL ANAT      ;CALL ANALYSIS SUB
                                         ;SUB WILL SET ANALYSIS STATUS BIT
                                         ;AND WILL RETURN TO EXEC WITH IT STILL SET
00B1  C3 [illegible] C    JMP CHKDSP     ;CONTINUE
00B4  3E 2F     CLRAN:    MVI A,2FH      ;RESET (CLEAR) ANALYZE FLAG BIT
00B6  21 16 1B  D         LXI H,STATUS   ;STATUS WORD ADDRESS
00B9  A6                  ANA M          ;CLEAR ANALYZE IN PROGRESS BIT
00BA  [illegible]         MOV M,A        ;SAVE STATUS
00BB  [illegible]         OUT 03         ;OUTPUT NEW STATUS WORD

00BD  DB 0[illegible] CHKDSP: IN 02      ;INPUT SWITCH INFO
00BF  E6 80               ANI 80H        ;IS DISPLAY SWITCH PRESSED?
```

```
0001  CA 85 00    C              JZ EXEC          ;IF NOT, LOOP FOREVER
0004  CD 95 04    C              CALL DSPLY       ;CALL DISPLAY ROUTINE
                                                  ;IT IS ASSUMED THAT THE X-Y RECORDER
                                                  ;IS ALREADY SETUP AND READY TO BEGIN
                                                  ;PLOTTING. ALSO, IT IS ASSUMED THAT
                                                  ;THE DISPLAY ARRAY HAS BEEN FILLED WITH
                                                  ;VALID DATA ALREADY.
00C7  C3 85 00    C              JMP EXEC         ;LOOP FOREVER
                          ANAL   CSEG P
                                                  ;ANALYSIS SUBROUTINE
                                                  ;THIS SUB WILL EXAMINE THE MODE
                                                  ;AND FUNCTION SWITCHES TO DETERMINE THE TYPE
                                                  ;OF DATA ANALYSIS DESIRED. THE APPROPRIATE ANALYSIS
                                                  ;SUB IS THEN CALLED TO PERFORM THE DESIRED TASK
                                                  ;THE RESULTS ARE PLACED IN THE DISPLAY ARRAY.
                                                  ;NOTE THAT THE ANALYSIS IN PROGRESS STATUS
                                                  ;BIT IS SET IN THIS SUB, BUT CLEARED IN THE EXEC
00CA  3E 10                      MVI A,10H        ;ANALYSIS IN PROGRESS FLAG BIT
00CC  21 16 18    D              LXI H,STATUS     ;STATUS WORD ADDRESS
00CF  B6                         ORA M            ;SET ANALYSIS BIT
00D0  E6 30                      ANI 30H          ;CLEAR ERROR FLAG
00D2  77                         MOV M,A          ;SAVE STATUS
00D3  D3 07                      OUT 07           ;OUTPUT NEW STATUS
00D5  DB 02                      IN 02            ;INPUT SWITCH INFO
00D7  E6 10                      ANI 10H          ;DETERMINE ANALYSIS MODE
00D9  C2 EF 00    C              JNZ TRANSF       ;IF 1, FWHT
                                                  ;IF 0, REAL TIME DATA

                                                  ;
                                                  ;REAL TIME DATA ANALYSIS
                                                  ;
00DC  DB 02                      IN 02            ;INPUT SWITCH INFO
00DE  E6 20                      ANI 20H          ;DETERMINE ANALYSIS FUNCTION
00E0  C2 E9 00    C              JNZ RTD          ;IF 1, JUMP
00E3  CD 00 01    C       RTS    CALL RLTS        ;CALL REAL TIME STORE SUB
                                                  ;STORE DATA IN REF AND DISPLAY ARRAYS.
00E6  C3 FF 00    C              JMP EXIT         ;
00E9  CD 3E 01    C       RTD    CALL RLTD        ;CALL REAL TIME DIFFERENCE SUB
                                                  ;STORE (DATA - REF) IN DISPLAY ARRAY
00EC  C3 FF 00    C              JMP EXIT         ;

                                                  ;
                                                  ;FAST WALSH HADAMARD TRANSFORM ANALYSIS
                                                  ;
00EF  DB 02               TRANSF: IN 02           ;INPUT SWITCH INFO
00F1  E6 20                      ANI 20H          ;DETERMINE ANALYSIS FUNCTION
00F3  C2 FC 00    C              JNZ WTD          ;IF =1, JUMP
00F6  CD 64 01    C       WTS    CALL WHTS        ;CALL FWHT SUB AND STORE RESULTS IN
                                                  ;REF AND DISPLAY ARRAYS.
00F9  C3 FF 00    C              JMP EXIT         ;
00FC  CD D0 01    C       WTD:   CALL WHTD        ;CALL FWHT SUB AND STORE (CURRENT
                                                  ;WALSH COEFF - REF) IN DISPLAY ARRAY

00FF  C9                  EXIT:  RET              ;EXIT
                          RLTS   CSEG P
                                                  ;THIS SUB WILL INPUT THE DATA FROM
                                                  ;THE DATA COLL BUFFER (1024 BYTES)
                                                  ;AND STORE IT IN THE REF AND THE DISPLAY
                                                  ;ARRAYS. NO OTHER PROCESSING OF THE DATA
                                                  ;IS PERFORMED.
0100                             ARRXF [illegible]
                                                  ;INPUT BUFFER TO REF ARRAY
011B                             ARRXF REF,1,DISP,1,1
                                                  ;COPY REF ARRAY INTO DISPLAY
0135  3E 00                      MVI A,00         ;CLEAR ACC
0137  32 00 04    D              STA DISP         ;CLEAR FIRST LOCATION OF DISPLAY
013A  32 00 00    D              STA REF          ;AND REF ARRAY SINCE FIRST DATA VALUE
                                                  ;IS GARBAGE
013D  C9                         RET


                          RLTD   CSEG P
                                                  ;THIS SUB WILL INPUT THE DATA FROM
                                                  ;THE DATA COLL BUFFER (1024 BYTES)
                                                  ;AND SUBTRACT THE RESPECTIVE REF
                                                  ;ARRAY ELEMENT FROM IT; THE DIFFERENCE WILL
                                                  ;BE STORED IN THE DISPLAY ARRAY. THE REF ARRAY
                                                  ;IS NOT ALTERED
                                                  ;DATA COLL BUFFER(I) - REF(I) ---DISPLAY(I)
013E                             ARRXF ,,DISP,1,1
                                                  ;INPUT BUFFER AND PUT DIFF INTO DISPLAY
015F  3E 00                      MVI A,00         ;CLEAR ACC
0160  32 00 04    D              STA DISP         ;CLEAR FIRST LOCATION OF DISPLAY ARRAY
                                                  ;SINCE FIRST DATA VALUE IS GARBAGE
0163  C9                         RET
                          WHTS   CSEG P
                                                  ;THIS SUB WILL INPUT THE DATA FROM
                                                  ;THE DATA COLL BUFFER (1024 BYTES)
                                                  ;AND STORE IT IN THE X ARRAY. NOTE THAT THE X ARRAY
                                                  ;IS DOUBLE PRECISION AND THAT THE MSB OF EACH
                                                  ;X ARRAY ELEMENT IS CLEARED. A FWHT IS
                                                  ;THEN PERFORMED UPON THE DATA. THE WALSH COEFF
                                                  ;[illegible]
                                                  ;[illegible]
                                                  ;TRANSITION
0164                             ARRXF ,,X,2,0
                                                  ;INPUT BUFFER TO THE X ARRAY
[illegible]                      MVI A,00         ;CLEAR ACC
[illegible]                      STA X            ;CLEAR FIRST LOCATION OF X ARRAY [illegible]
```

```
                                             ;FIRST DATA VALUE IS GARBAGE
     01EA  CD 2E 02    C           CALL FWHT ;TRANSFORM THE DATA
                                             ;COEFF WILL BE LEFT IN THE Y ARRAY
                                   ARRXF Y,2,REF+1,
                                             ;PUT COEFF INTO REF ARRAY
                                   ARRXF Y,2,DISP+1,
                                             ;PUT COEFF INTO DISPLAY ARRAY
     01DF  AF                      XRA A     ;;;;CLEAR ACC
     01E0  2F                      CMA       ;;;;OUTPUTS ARE INVERTED
     01E1  D3 20                   OUT 20H   ;;;;CLEAR INDICATOR LAMPS
     01E3  D3 21                   OUT 21H   ;;;;;ON DISPLAY FOD
     01E5  C9                      RET


                        WHTD       CSEG P
                                             ;THIS SUB WILL INPUT THE DATA FROM
                                             ;THE DATA COLL BUFFER (1024 BYTES)
                                             ;AND STORE IT IN THE X ARRAY. NOTE THAT THE X
                                             ;ARRAY IS DOUBLE PRECISION AND THAT THE MSB
                                             ;OF EACH X ARRAY ELEMENT IS CLEARED. A FWHT
                                             ;IS THEN PERFORMED UPON THE DATA. THE COEFF
                                             ;ARE SCALED TO AN 8 BIT MAGNITUDE.
                                             ;THE DIFFERENCE OF THE JUST CALCULATED COEFF
                                             ;AND THE RESP REF ARRAY ELEMENT IS STORED
                                             ;IN THE DISPLAY ARRAY. THE REF ARRAY
                                             ;IS NOT ALTERED.
     0100                          ARRXF ,,X,2,0
                                             ;INPUT BUFFER TO THE X ARRAY
     01FB  3E 00                   MVI A,00  ;CLEAR ACC
     01FD  32 00 08    D           STA X     ;CLEAR FIRST LOCATION OF X ARRAY SINCE
                                             ;FIRST DATA VALUE IS GARBAGE
     0200  CD [illegible]   C      CALL FWHT ;TRANSFORM THE DATA
                                             ;COEFF WILL BE LEFT IN THE Y ARRAY
     [illegible]                   ARRXF Y,2,DISP+1,
                                             ;PUT DIFF OF THE JUST CALC COEFF
                                             ;INTO DISP ARRAY
     021F  DB 20                   IN 20H    ;;;;INPUT SWITCH INFO FROM SEC 508
     0221  2F                      CMA       ;;;;INPUT DATA IS INVERTED
     0222  F6 00                   ORI 0     ;;;;TEST SIGN
     0224  FC 00 00                CM MGEN   ;;;;;IF NEG, CALL MGEN
     [illegible]  C9               RET       ;DONE


                        FWHT       CSEG P
                                             ;THIS SUB WILL PERFORM A FAST WALSH HADAMARD
                                             ;TRANSFORM, WITH THE RESULTANT COEFF IN NATURAL
                                             ;ORDERING. NO REORDERING OF THE DATA OR COEFF IS
                                             ;DONE.
                                             ;INPUT IS THE X ARRAY (1024 ELEMENTS)(16 BIT)
                                             ;OUTPUT IS THE Y ARRAY (1024 ELEMENTS)(16 BITS)
                                             ;FOR EACH ITERATION X IS OPERATED UPON
                                             ;AND THE RESULTS ARE PUT IN Y. Y IS THEN
                                             ;COPIED INTO X BEFORE THE NEXT ITERATION.
                                             ;THE ROUTINE WILL SCALE THE FINAL COEFF TO
                                             ;AN 8 BIT, 2'S COMPL MAGNITUDE AND LEAVE THEM
                                             ;IN THE Y ARRAY. THE ROUTINE ASSUMES 1024 DATA POINTS,
                                             ;AND HENCE 10 ITERATIONS.
     022B  21 00 18    D           LXI H,ITERN ;ITERN ADDR
     022E  36 01                   MVI M,01H ;SET ITERATION COUNTER TO 1
     022D  23                      INX H     ;NEXT BYTE
     022E  36 00                   MVI M,0   ;CLEAR MSB


     0230  21 00 18    D  ITRLPT   LXI H,ITERN ;ITERN ADDR
     0233  7E                      MOV A,M   ;GET ITERATION NUMBER
     0234  FE 01                   CPI 01H   ;IS THIS FIRST ITERATION?
     [illegible]  C2 44 02   C      JNZ NIDIT ;JUMP IF NOT
     0237  21 02 18    D  BEGIT:   LXI H,NUMP ;NUMP ADDR
     023A  36 01                   MVI M,01H ;SET NUMP TO 1
     023C  23                      INX H     ;NEXT BYTE
     023F  36 00                   MVI M,0   ;CLEAR MSB
     0241  C3 4F 02    C           JMP ITEAL ;CONTINUE
                                             ;MULTIPLY NUMBER OF PARTITIONS
                                             ;(NUMP) BY 2 FOR EACH SUCCESSIVE
                                             ;ITERATION
     0244  21 02 18    D  NIDIT:   LXI H,NUMP ;NUMP ADDR
     0247  AF                      XRA A     ;CLEAR CARRY BIT
     0248  7E                      MOV A,M   ;PUT NUMP INTO ACC
     [illegible]                             ;MULTIPLY BY 2
     [illegible]                   MOV [illegible] ;SAVE LSB
     [illegible]                   INX [illegible] ;NEXT BYTE
     [illegible]                   MOV A,M   ;PUT NUMP MSB INTO ACC
     [illegible]                   RAL       ;SHIFT
     [illegible]                   MOV [illegible] ;SAVE MSB
                       D  [illegible]  LHLD NUMP ;PUT VALUE OF NUMP IN H,L
                                             ;[illegible]
                                             ;[illegible]
     [illegible]                   LXI [illegible] ;[illegible] VALUE OF NUM (=1024, CONSTANT)
                                             ;NUMBER OF ELEMENTS/PARTITION (NUMEL) =
                                             ;NUMBER OF DATA VALUES (NUM) / NUMBER OF
                                             ;[illegible]
                                             ;[illegible]
                                   [illegible] ;[illegible]


     [illegible]                   MOV B,A   ;RESTORE
     [illegible]  7B               MOV A,E   ;NUMEL LSB
     [illegible]  1F               RAR       ;SHIFT RIGHT
     025F  5F                      MOV E,A   ;RESTORE
```

```
0258   DA 69 02    C           JC CONT          ;IF CARRY IS SET, DONE
0260   7C                      MOV A,H          ;NUM MSB
0261   1F                      RAR              ;SHIFT RIGHT
0262   67                      MOV H,A          ;RESTORE
0263   7D                      MOV A,L          ;NUM LSB
0264   1F                      RAR              ;SHIFT RIGHT
0265   6F                      MOV L,A          ;RESTORE
0266   C3 56 02    C           JMP NUMLP        ;LOOP UNTIL DIVISION COMPLETE
0269   22 04 18    D   CONT:   SHLD NUMEL       ;SAVE NEW VALUE OF NUMEL
                                                ;DIVIDE NUMEL BY 2 TO GET NUMEL2
                                                ;(NUMBER OF ELEMENTS WITH THE SAME
                                                ;ARITHMATIC OPERAND)
026C   AF                      XRA A            ;CLEAR CARRY
026D   7C                      MOV A,H          ;NUMEL MSB
026E   1F                      RAR              ;SHIFT RIGHT
026F   67                      MOV H,A          ;RESTORE
0270   7D                      MOV A,L          ;NUMEL LSB
0271   1F                      RAR              ;SHIFT RIGHT
0272   6F                      MOV L,A          ;RESTORE
0273   22 06 18    D           SHLD NUMEL2      ;SAVE NEW VALUE OF NUMEL2
                                                ;(=NUMEL/2)
                                                ;
                                                ;NOW LOOP FOR EACH PARTITION
                                                ;
0276   21 08 18    D           LXI H,PNUM       ;PNUM ADDRESS
0279   36 01                   MVI M,01H        ;SET PARTITION COUNTER TO 001
027B   23                      INX H            ;NEXT (MSB) BYTE
027C   36 00                   MVI M,00H        ;CLEAR MSB
                                                ;
                                                ;
027E   2A 04 18    D   PLOOP:  LHLD NUMEL       ;PUT VALUE OF NUMEL IN H,L
0281   EB                      XCHG             ;PUT INTO D,E REG
                                                ;D=MSB    E=LSB
0282   2A 08 18    D           LHLD PNUM        ;PUT PNUM VALUE IN H,L
0285   2B                      DCX H            ;SUBTRACT ONE
                                                ;NOW MULTIPLY (PNUM-1) BY NUMEL
                                                ;NUMEL IS ALWAYS AN EXACT POWER OF 2
0286   AF              PNUMC:  XRA A            ;CLEAR CARRY
0287   7A                      MOV A,D          ;NUMEL MSB
0288   1F                      RAR              ;SHIFT RIGHT
0289   57                      MOV D,A          ;RESTORE
028A   7B                      MOV A,E          ;NUMEL LSB
028B   1F                      RAR              ;SHIFT RIGHT
028C   5F                      MOV E,A          ;RESTORE
028D   DA 99 02    C           JC PCONT         ;DONE?
                                                ;CARRY FLAG IS CLEARED NOW
0290   7D                      MOV A,L          ;PNUM LSB
0291   17                      RAL              ;SHIFT LEFT
0292   6F                      MOV L,A          ;RESTORE
0293   7C                      MOV A,H          ;PNUM MSB
0294   17                      RAL              ;SHIFT LEFT
0295   67                      MOV H,A          ;RESTORE
0296   C3 86 02    C           JMP PNUMC        ;LOOP UNTIL MULTIPLY COMPLETE
0299   22 0A 18    D   PCONT:  SHLD POFF        ;SAVE NEW VALUE OF POFF
                                                ;
                                                ;CALCULATE AFTR AND SFTR
                                                ;(ARRAY POINTERS FOR ADD,SUB OPERATIONS)
                                                ;DO FOR EACH PAIR OF ELEMENTS IN THIS
                                                ;PARTITION.
                                                ;
029C   21 0C 18    D           LXI H,PINDEX     ;PINDEX ADDRESS
029F   36 01                   MVI M,01H        ;SET PARTITION INDEX TO 001
02A1   23                      INX H            ;NEXT BYTE
02A2   36 00                   MVI M,00H        ;CLEAR MSB
                                                ;
                                                ;
02A4   2A 0A 18    D   PARLP:  LHLD POFF        ;
02A7   22 17 18    D           SHLD ARG1        ;PUT POFF INTO ARG 1
02AA   2A 0C 18    D           LHLD PINDEX      ;
02AD   22 19 18    D           SHLD ARG2        ;PUT PINDEX INTO ARG 2
02B0   CD 34 00    C           CALL FXADD       ;ADD PINDEX AND POFF
02B3   2A 17 18    D           LHLD ARG1        ;GET ABOVE ANSWER
02B6   2B                      DCX H            ;SUBTRACT ONE
02B7   22 17 18    D           SHLD ARG1        ;RETURN ARG
02BA   22 10 18    D           SHLD AFTR        ;SAVE IN A POINTER
02BD   2A 06 18    D           LHLD NUMEL2      ;
02C0   22 19 18    D           SHLD ARG2        ;PUT NUMEL2 INTO ARG 2
02C3   CD 34 00    C           CALL FXADD       ;ADD NUMEL2 TO THE ABOVE
02C6   2A 17 18    D           LHLD ARG1        ;GET ABOVE ANSWER
02C9   22 0E 18    D           SHLD SFTR        ;SAVE IN S POINTER

02CF   AF                      XRA A            ;CLEAR CARRY
02D0   3A 10 18    D           LDA AFTR         ;GET AFTR LSB
02D3   17                      RAL              ;MULTIPLY IT BY 2 TO GET
02D4   32 10 18    D           STA AFTR         ;A WORD OFFSET FOR X,Y ARRAYS
02D7   3A 11 18    D           LDA AFTR+1       ;GET AFTR MSB
02DA   17                      RAL              ;
02DB   32 11 18    D           STA AFTR+1       ;AFTR NOW A WORD OFFSET
                                                ;
02DE   AF                      XRA A            ;CLEAR CARRY
02DF   3A 0E 18    D           LDA SFTR         ;GET SFTR LSB
02E2   17                      RAL              ;MULTIPLY IT BY 2 TO GET
02E3   32 0E 18    D           STA SFTR         ;A WORD OFFSET FOR X,Y ARRAYS
02E6   3A 0F 18    D           LDA SFTR+1       ;GET SFTR MSB
02E9   17                      RAL              ;
02EA   32 0F 18    D           STA SFTR+1       ;SFTR NOW A WORD OFFSET
                               ADDR AFTR,X      ;CALL ADDR X(AFTR)

                               ARG1             ;PUT X(AFTR) INTO ARG1
                               ADDR SFTR,X      ;CALL ADDR X(SFTR)
                               ARG2             ;PUT X(SFTR) INTO ARG 2
       CD 34 00    C           CALL FXADD       ;ADD X(AFTR) AND X(SFTR)
```

```
0308                          AINDX AFTR,Y    ;CALC ADDR Y(AFTR)
031[illegible]                MOVEM ARG1      ;Y(AFTR) = X(AFTR) + X(SPTR)

0320                          AINDX AFTR,X    ;CALC ADDR X(AFTR)
0320                          FILL ARG1       ;PUT X(AFTR) INTO ACC 1
0331                          AINDX SPTR,X    ;CALC ADDR X(SPTR)
[illegible]                   FILL ARG2       ;PUT X(SPTR) INTO ACC 2
[illegible]  CD 40 0C      C  CALL FSUB       ;SUBTRACT X(SPTR) FROM X(AFTR)
[illegible]                   AINDX SPTR,Y    ;CALC ADDR Y(SPTR)
0340                          MOVEM ARG1      ;Y(SPTR) = X(AFTR) - X(SPTR)

0352  2A 0C 1B  D             LHLD FINDEX     ;GET FINDEX VALUE
0359                          DCMP NUMEL2     ;DONE IN THIS PARTITION?
0369  CA 73 03  C             JZ PCPDN        ;JUMP IF DONE
036C  23                      INX H           ;NEXT ELEMENT WITHIN THE CURR PARTITION
036D  22 0C 1B  D             SHLD FINDEX     ;SAVE FINDEX VALUE
0370  C3 A4 02  C             JMP PARLP       ;LOOP UNTIL DONE WITH THIS PARTITION
0373  2A 0B 1B  D    PCPDN:   LHLD PNUM       ;GET PNUM VALUE
0376                          DCMP NUMP       ;HAVE ALL THE PARTITIONS BEEN DONE?
0386  CA 90 03  C             JZ PARDN        ;IF SO, JUMP
0389  23                      INX H           ;NEXT PARTITION
038A  22 08 1B  D             SHLD PNUM       ;SAVE PNUM VALUE
038D  C3 7E 02  C             JMP PLOOP       ;DO NEXT PARTITION
0390  2A 00 1B  D    PARDN:   LHLD ITERN      ;GET ITERN VALUE
0393                          DCMP ITER       ;HAVE ALL THE ITERATIONS BEEN COMPLETED?
03A3  CA 39 04  C             JZ ALLDN        ;IF SO, ALL DONE, SO JUMP
03A6                          DCMP NLFDN      ;IS THIS THE 5TH ITERATION?
03B6  C2 FF 03  C             JNZ ITCNT       ;IF NOT, CONTINUE
                                              ;DUE TO LIMITED WORD LENGTH, IT IS
                                              ;NECESSARY TO DIVIDE THE CONTENTS OF THE
                                              ;Y ARRAY BY 4 AFTER THE 5TH ITERATION TO
                                              ;PREVENT ARITHMATIC OVERFLOW.
                                              ;SINCE THE FINAL RESULT IS ONLY 8 BITS
                                              ;RESOLUTION, IT IS NOT NECESSARY TO DO
                                              ;16 BIT ARITHMATIC, WHICH WOULD BE REQUIRED.
03B9  21 00 10  D             LXI H,Y         ;GET ADDR OF BEGINNING OF Y ARRAY
03BC                 YCPY:    FILL TEMP       ;GET NEXT Y ARRAY ELEMENT INTO TEMP
03C5  01 02 00                LXI B,0002H     ;INIT LOOP COUNTER FOR DIVIDE BY 4
                                              ;(SHIFT RIGHT TWICE)
03C8  AF             NLOOP:   XRA A           ;CLEAR CARRY
03C9  3A 1C 1B  D             LDA TEMP+1      ;PUT MSB INTO ACC
03CC  E6 00                   ORI 00          ;SET/CLEAR SIGN FLAG
03CE  F2 [illegible]  C       JP PNLP         ;IF POSITIVE, JUMP
03D1  37                      STC             ;SET CARRY FLAG (SIGN EXTEND)

03D2  1F             PNLP:    RAR             ;SHIFT RIGHT ONCE
                                              ;LSB SHIFTED INTO CARRY BIT
03D3  32 1C 1B  D             STA TEMP+1      ;SAVE MSB
03D6  3A 1B 1B  D             LDA TEMP        ;PUT LSB INTO ACC
03D9  1F                      RAR             ;SHIFT RIGHT ONCE
                                              ;CARRY SHIFTED INTO MSB
03DA  32 1B 1B  D             STA TEMP        ;SAVE LSB
03DD  0D                      DCR C           ;DECR LOOP COUNTER (REG C)
03DE  C2 C8 03  C             JNZ NLOOP       ;LOOP TWICE
03E1  2B                      DCX H           ;ADDR OF Y LSB
03E2                          MOVEM TEMP      ;PUT SCALED Y VALUE INTO Y ARRAY
03EB  23                      INX H           ;NEXT Y ARRAY WORD
03EC                          DCMP LIMIT      ;DONE?
03FC  C2 BC 03  C             JNZ YCPY        ;LOOP UNTIL ALL ARE SCALED
                                              ;
                                              ;
03FF  2A 00 1B  D    ITCNT:   LHLD ITERN      ;GET ITERN VALUE
0402  23                      INX H           ;NEXT ITERATION
0403  22 00 1B  D             SHLD ITERN      ;SAVE ITERN VALUE
0406                          ARRXF Y,1,X,1,0
                                              ;COPY FIRST HALF OF Y INTO X ARRAY (1024 BYTES)
041F                          ARRXF YMID,1,XMID,1,0
                                              ;COPY SECOND HALF OF Y INTO X ARRAY (1024 BYTES)
0436  C3 30 02  C             JMP ITRLP       ;DO NEXT ITERATION
                                              ;
                                              ;FWHT IS COMPLETE.
                                              ;COEFFICIENTS ARE NOW IN Y ARRAY.
                                              ;WE MUST DIVIDE THE COEFFICIENTS TO
                                              ;SCALE THEM TO 8 BITS (2'S COMPLEMENT)
                                              ;TO BE EXACT, WE WOULD DIVIDE BY NUM
                                              ;(1024), BUT THIS WOULD GIVE FRACTIONAL NUMBERS.
                                              ;
0439  21 00 10  D    ALLDN:   LXI H,Y         ;GET ADDR OF BEGINNING OF Y ARRAY
043C                 XYCPY:   FILL TEMP       ;GET NEXT Y ARRAY ELEMENT INTO TEMP
                                              ;
                                              ;DIVIDE BY 64 TO NORMALIZE
                                              ;RESULT TO AN 8 BIT VALUE. IF RESULT FROM
                                              ;DIVISION IS GREATER THAN 8 BITS, OUTPUT
                                              ;+127 OR -128, DEPENDING UPON SIGN
                                              ;
0445  01 06 00                LXI B,0006H     ;DIVIDE BY 64
0448  AF             XLOOP:   XRA A           ;CLEAR CARRY
0449  3A 1C 1B  D             LDA TEMP+1      ;PUT MSB INTO ACC
044C  1F                      RAR             ;SHIFT RIGHT ONCE
                                              ;LSB SHIFTED INTO CARRY BIT
044D  32 1C 1B  D             STA TEMP+1      ;SAVE MSB
0450  3A 1B 1B  D             LDA TEMP        ;PUT LSB INTO ACC
[illegible]  1F                RAR            ;SHIFT RIGHT ONCE
                                              ;CARRY SHIFTED INTO MSB
[illegible]                   STA TEMP        ;SAVE LSB
[illegible]                   DCR C           ;DECR LOOP COUNTER (REG C)
[illegible]                   JNZ XLOOP       ;[illegible]
                                              ;[illegible] TEMP VALUE IS NEGATIVE
                                              ;[illegible]
                                              ;[illegible]
[illegible]                   [illegible]     ;[illegible] OKAY, NORMAL NEGATIVE NUMBER
```

```
0466  E6 80                     ANI 80H            ;CHECK IF POSITIVE OR NEGATIVE
0468  CA 70 04       C          JZ POVF            ;JUMP IF POSITIVE OVERFLOW
046B  3E 80                     MVI A,80H          ;OUTPUT -128
046D  C3 72 04       C          JMP OVFL           ;CONTINUE
0470  3E 7F             POVF:   MVI A,7FH          ;OUTPUT +127
0472  32 18 18       D  OVFL:   STA TEMP           ;OVERWRITE TEMP WITH ERROR CONDITION VALUE
0475  00                XOKAY:  NOP                ;

0476  2B                        DCX H              ;ADDR OF Y LSB
0477                            MOVEM TEMP         ;PUT SCALED Y VALUE INTO Y ARRAY
0480  23                        INX H              ;NEXT Y ARRAY WORD
0481                            DCMP LIMIT         ;DONE?
0491  C2 3C 04       C          JNZ XYCPY          ;LOOP UNTIL ALL ARE SCALED
0494  C9                        RET                ;NOW COMPLETELY DONE
                                CSEG P
                        DPLOT:                     ;SUBROUTINE TO OUTPUT THE CONTENTS OF THE
                                                   ;DISPLAY ARRAY TO THE X-Y PLOTTER.
                                                   ;PLOTTER SHOULD BE SET UP SUCH THAT A FULL
                                                   ;100HZ SWEEP WILL TAKE 4.3 MINUTES.
                                                   ;A NEW VALUE IS OUTPUTTED AND LATCHED
                                                   ;EVERY 250 MSEC. AT THE BEGINNING OF THE
                                                   ;PLOT, ZERO IS OUTPUTTED FOR 2 SEC
0495  3E 20                     MVI A,20H          ;DISPLAY FLAG BIT
0497  21 1A 18       D          LXI H,STATUS       ;STATUS WORD ADDR
049A  B6                        ORA M              ;SET DISPLAY FLAG
                                                   ;THIS WILL AUTOMATICALLY START THE X-Y REC
049B  77                        MOV M,A            ;SAVE THE STATUS WORD
049C  D3 03                     OUT 03             ;OUTPUT THE NEW STATUS
                                                   ;
                                                   ;NOW SETUP TIMER FOR A 125 MSEC TIMEOUT
                                                   ;WHEN THE TIMER INTERRUPT IS ENABLED, THE
                                                   ;RST7.5 ISR WILL SET REG B = 0FFH.
                                                   ;FOR 1MHZ INPUT TO THE TIMER
                                                   ;COUNT FOR 125 MSEC = 1E848H [illegible]
                                                   ;
049E  06 00                     MVI B,0            ;CLEAR REG B
04A0  3E 00                     MVI A,0            ;LSB OF TIMER COUNT
04A2  D3 04                     OUT 04             ;OUTPUT LSB
04A4  3E FC                     MVI A,0FCH         ;MSB OF TIMER COUNT (+2 CONTROL BITS)
04A6  D3 05                     OUT 05             ;OUTPUT MSB (+ CONTROL BITS)
                                                   ;THE TIMER WILL OUTPUT A PULSE EVERY
                                                   ;125 MSEC. AND THEN RELOAD THE TIMER COUNT
                                                   ;AUTOMATICALLY AND REPEAT.
04A8  3E 1B                     MVI A,00011011B    ;SIM INSTRUCTION MASK
04AA  30                        SIM                ;UNMASK RST7.5 INTERRUPTS
04AB  FB                        EI                 ;ENABLE INTERRUPTS
04AC  3E CD                     MVI A,11001101B    ;CSR WORD FOR 120
                                                   ;START THE TIMER
                                                   ;DISABLE PORT INTERRUPTS
                                                   ;PORT 01 = OUTPUT
                                                   ;PORT 02 = INPUT
                                                   ;PORT 03 = OUTPUT
04AE  D3 00                     OUT 00             ;OUTPUT 120 CSR
04B0  21 00 04       D          LXI H,DISP         ;BEGINNING ADDR OF DISPLAY ARRAY
04B3  3E 00                     MVI A,0            ;CLEAR ACC
04B5  D3 01                     OUT 01             ;OUTPUT A ZERO TO X-Y REC
04B7  16 10                     MVI D,16D          ;TIMER LOOP COUNTER
04B9  1E 00                     MVI E,0            ;CLEAR REG E
04BB  B0                TIM1:   ORA B              ;TIMER TIME OUT YET?
04BC  CA BB 04       C          JZ TIM1            ;LOOP UNTIL IT DOES
04BF  06 00                     MVI B,0            ;TIMER DID TIME OUT
                                                   ;CLEAR REG B
04C1  3E 00                     MVI A,0            ;CLEAR ACC
04C3  15                        DCR D              ;DECR TIMER LOOP COUNTER
04C4  C2 BB 04       C          JNZ TIM1           ;LOOP FOR 2 SECONDS
04C7  7E                TIMLP:  MOV A,M            ;GET NEXT DISPLAY ELEMENT
04C8  D3 01                     OUT 01             ;OUTPUT TO X-Y REC
04CA  23                        INX H              ;INCR TO NEXT ARRAY ELEMENT
04CB  16 02                     MVI D,02H          ;TIMER LOOP COUNTER
04CD  3E 00                     MVI A,0            ;CLEAR ACC
04CF  B0                TIM2:   ORA B              ;TIMER TIME OUT?
04D0  CA CF 04       C          JZ TIM2            ;LOOP UNTIL IT DOES
04D3  06 00                     MVI B,0            ;TIMER DID TIME OUT
                                                   ;CLEAR REG B
04D5  3E 00                     MVI A,0            ;CLEAR ACC
04D7  15                        DCR D              ;DECR TIMER LOOP COUNTER
04D8  C2 CF 04       C          JNZ TIM2           ;LOOP IF NOT 250 MSEC
04DB                            DCMP DLIM          ;DONE WITH WHOLE DISPLAY?
04EB  C2 C7 04       C          JNZ TIMLP          ;LOOP IF NOT DONE
04EE  F3                        DI                 ;DISABLE INTERRUPTS
                                                   ;DISPLAY NOW COMPLETED
                                                   ;NOW MUST STOP THE TIMER
04EF  3E 4C                     MVI A,01001100B    ;CSR WORD FOR 120
                                                   ;STOP THE TIMER
                                                   ;DISABLE PORT INTERRUPTS
                                                   ;[illegible]
                                                   ;[illegible]
                                                   ;[illegible]
04F1  D3 00                     OUT 00             ;OUTPUT 120 CSR
04F3  3E 1F                     MVI A,1FH          ;CLEAR DISPLAY STATUS FLAG BIT
04F5  21 1A 18       D          LXI H,STATUS       ;GET STATUS ADDR
04F8  A6                        ANA M              ;CLEAR DISPLAY BIT
04F9  77                        MOV M,A            ;PRESERVE ERROR AND ANALYSIS BITS
04FA  D3 03                     OUT 03             ;OUTPUT NEW STATUS
04FC  C9                        RET                ;DONE
04FD                            END START

ASSEMBLER ERRORS =     0
```

MASK VER.---FWHI PROGRAM

CROSS REFERENCE

| LABEL | VALUE | REFERENCE | | | | | | | |
|---|---|---|---|---|---|---|---|---|---|
| ALLDB | C 04[illegible] | 1587 | -1837 | | | | | | |
| [illegible] | [illegible] | 501 | -512 | | | | | | |
| [illegible] | [illegible] | 497 | 501 | | | | | | |
| [illegible] | [illegible] | [illegible] | 261 | 282 | 289 | -293 | | | |
| [illegible] | [illegible] | 87 | 257 | 265 | 1375 | 1383 | 1385 | 1386 | 1388 |
| | | 1465 | 1448 | 1470 | | | | | |
| [illegible] | D 10[illegible] | -107 | 347 | 381 | 1366 | 1372 | 1374 | 1379 | 1415 |
| | | 1418 | 1457 | 1460 | 1480 | 1483 | 1533 | 1535 | |
| [illegible] | D 10[illegible] | 109 | 348 | 382 | 1370 | 1377 | 1436 | 1439 | 1501 |
| | | 1504 | | | | | | | |
| [illegible] | C 07[illegible] | -1270 | | | | | | | |
| CHKDSP | C 0080 | 486 | 504 | -511 | | | | | |
| CLKAD | C 0084 | 482 | -505 | | | | | | |
| [illegible] | [illegible] | -457 | 475 | | | | | | |
| [illegible] | C 0267 | 1301 | -1309 | | | | | | |
| [illegible] | [illegible] | -489 | 491 | | | | | | |
| [illegible] | D 0400 | -68 | 141 | 666 | 728 | 756 | 818 | 1004 | 1175 |
| | | 1943 | | | | | | | |
| [illegible] | 0064 | -141 | 1975 | 1978 | | | | | |
| [illegible] | C 0495 | 514 | -1905 | | | | | | |
| EXEC | C 0085 | -480 | 500 | 513 | 520 | | | | |
| [illegible] | C 00FF | 550 | 553 | 563 | -567 | | | | |
| FWHI | C 0228 | 911 | 1162 | -1247 | | | | | |
| HEIDN | 0066 | -143 | 1596 | 1599 | | | | | |
| HLDOD | C 03FB | -1624 | 1537 | | | | | | |
| [illegible] | 003C | -123 | | | | | | | |
| [illegible] | C 024F | 1274 | -1287 | | | | | | |
| [illegible] | C 03FF | 1604 | -1668 | | | | | | |
| [illegible] | 0062 | -139 | 1579 | 1582 | | | | | |
| [illegible] | D 1800 | -88 | 1261 | 1266 | 1570 | 1668 | 1670 | | |
| [illegible] | C 0230 | -1266 | 1823 | | | | | | |
| [illegible] | 0060 | -130 | 467 | 470 | 1657 | 1660 | 1893 | 1896 | |
| [illegible] | C 005C | -439 | | | | | | | |
| [illegible] | 0060 | -112 | | | | | | | |
| MEMORY | M 0000 | 0 | | | | | | | |
| [illegible] | 0800 | -111 | 1244 | | | | | | |
| [illegible] | C 0244 | 1269 | -1278 | | | | | | |
| [illegible] | C 0000 | -242 | 289 | 1212 | | | | | |
| [illegible] | 0000 | 591 | 598 | 667 | 674 | 757 | 764 | 848 | 855 |
| | | 929 | 936 | 1005 | 1012 | 1099 | 1106 | 1180 | 1187 |
| | | 1687 | 1694 | 1763 | 1770 | | | | |
| [illegible] | C 002A | 279 | -287 | | | | | | |
| [illegible] | 0400 | 87 | 1290 | | | | | | |
| [illegible] | D 1804 | -90 | 1307 | 1331 | | | | | |
| [illegible] | D 1006 | -91 | 1320 | 1376 | 1537 | 1540 | | | |
| [illegible] | C 02[illegible] | -1294 | 1308 | | | | | | |
| [illegible] | D 1802 | -89 | 1270 | 1278 | 1287 | 1558 | 1561 | | |
| [illegible] | C 00[illegible] | 273 | -272 | | | | | | |
| PAKDD | C 0390 | 1566 | -1570 | | | | | | |
| [illegible] | C 0264 | 1367 | 1548 | | | | | | |
| [illegible] | C 0299 | 1345 | -1354 | | | | | | |
| [illegible] | C 036[illegible] | 1627 | -1629 | | | | | | |
| PINDEX | D 1800 | -95 | 1361 | 1369 | 1528 | 1547 | | | |
| [illegible] | C [illegible]7E | -1331 | 1569 | | | | | | |
| [illegible] | C 02[illegible] | 1545 | -1549 | | | | | | |
| [illegible] | D 10[illegible] | 93 | 1325 | 1334 | 1549 | 1568 | | | |
| [illegible] | C 02[illegible] | -1338 | 1353 | | | | | | |
| [illegible] | D 10[illegible] | 94 | 1354 | 1367 | | | | | |
| [illegible] | C 0[illegible] | -280 | | | | | | | |
| [illegible] | C 04[illegible] | 1867 | -1870 | | | | | | |
| [illegible] | C 0034 | -329 | 1371 | 1378 | 1440 | | | | |
| [illegible] | C 00[illegible] | -323 | 1505 | | | | | | |
| [illegible] | 0000 | 117 | | | | | | | |
| [illegible] | D 0000 | 65 | 267 | 456 | 590 | 671 | 729 | 928 | |
| [illegible] | C 013E | 551 | -733 | | | | | | |
| [illegible] | C 0109 | 548 | -569 | | | | | | |
| [illegible] | C 00[illegible] | 54 | -551 | | | | | | |
| [illegible] | [illegible] | -54F | | | | | | | |
| [illegible] | D [illegible] | [illegible] | 1380 | 1391 | 1393 | 1394 | 1396 | 1426 | 1491 |
| | | [illegible] | | | | | | | |
| [illegible] | [illegible] | [illegible] | | | | | | | |
| [illegible] | C 0051 | 116 | 120 | -443 | 2006 | | | | |
| STATUS | D 18[illegible] | -105 | 446 | 483 | 496 | 506 | 532 | 1913 | 1995 |
| [illegible] | D 1[illegible] | 116 | 1618 | 1621 | 1625 | 1631 | 1632 | 1635 | 1643 |
| | | 1645 | 1838 | 1841 | 1851 | 1854 | 1855 | 1858 | 1861 |
| | | 1871 | 1875 | 1882 | | | | | |
| TIM1 | C 01BF | -1948 | 1949 | 1954 | | | | | |
| [illegible] | C 041F | -1960 | 1961 | 1966 | | | | | |
| [illegible] | C 041[illegible] | -1955 | 1983 | | | | | | |
| [illegible] | C 00FF | 535 | 550 | | | | | | |
| [illegible] | 00[illegible]4 | -12[illegible] | | | | | | | |
| [illegible] | C [illegible] | [illegible] | 1071 | | | | | | |
| [illegible] | C 0[illegible] | 581 | -822 | | | | | | |
| [illegible] | C 00[illegible] | 566 | -564 | | | | | | |
| [illegible] | C 00[illegible] | -561 | | | | | | | |
| [illegible] | D [illegible] | 77 | 100 | 847 | 909 | 1098 | 1160 | 1407 | 1428 |
| | | 14[illegible] | 149[illegible] | 1656 | | | | | |
| [illegible] | D [illegible] | [illegible] | | | | | | | |
| [illegible] | C 03[illegible] | -1050 | 1030 | | | | | | |
| [illegible] | D [illegible] | -100 | 1767 | | | | | | |
| [illegible] | C 0[illegible] | 1862 | 1865 | -1872 | | | | | |
| [illegible] | D 101[illegible] | 99 | | | | | | | |
| [illegible] | C 0[illegible] | -1[illegible] | 1901 | | | | | | |
| [illegible] | D [illegible] | [illegible] | 101 | 133 | 933 | 1009 | 1184 | 1450 | 1515 |
| | | 1517 | 1891 | 1837 | | | | | |
| [illegible] | [illegible] | -1613 | 1660 | | | | | | |
| [illegible] | D 1[illegible] | 101 | 1767 | | | | | | |

[illegible]

```
LOC LINE  ADDR  B1 B2 B3 B4        FWHT MASK ANALYSIS

                                ;TITLE   'FWHT MASK ANALYSIS'
                                 NAME    WMASK
                                 LIST F,...
                                ;
                                ;
                                ;  ************************************************
                                ;  *                                              *
                                ;  *       FWHT MASK ANALYSIS PROGRAM             *
                                ;  *                                              *
                                ;  ************************************************
                                ;
                                ;
                                ;  DISC FILE NAME IS   WMASK.FXT   (MACIOPJ)LSTIMAP)SAVT
                                ;
                                ;
                                ;THIS PROGRAM IS INTENDED TO BE STORED IN PROM Y2 ON THE INTEL SBC 80/05
                                ;THE PROGRAM IS WRITTEN IN ABSOLUTE CODE TO FACILITATE THE FEW REFERENCE
                                ;THIS PROGRAM MUST MAKE WITH THE EXISTING PROM PROGRAM (FWHT).
                                ;THE PROGRAM IS ACTUALLY ONE SUBROUTINE WITH TWO DIFFERENT ENTER POINTS
                                ;IN THE FWHT PROGRAM, AFTER IT HAS DETERMINED THE FWHT AND STORED THE
                                ;REFERENCE ARRAY INTO REF & DISP, IT WILL TEST IF A BIT IS SET ON THE
                                ;SENSOR I/O BOARD (THE SIGN BIT, BIT 7, OF THE FIRST INPUT PORT
                                ;IS SET TO '1' IF MGEN IS TO BE CALLED). IF THE BIT IS CLEARED ('0'), TH
                                ;OPERATION IS EXACTLY AS THE OLD FWHT PROGRAM SEQUENCE. IF THE BIT IS SE
                                ;THEN THE FWHT WILL CALL THIS SUB AT THE MGEN ENTER POINT.
                                ;
                                ;
                                ;THIS SUB IS ENTERED AT MGEN BY CALLING THE SUB MGEN.
                                ;THIS SUB CONSISTS OF TWO PARTS:
                                ;       1. CALCULATE THE CITY-BLOCK DISTANCE
                                ;          BETWEEN THE REF AND CURRENT DIGIT.
                                ;          FWHT COEFFICIENT VECTORS
                                ;       2. BY EXAMINING THE Y ARRAY, DETERMINE THE
                                ;          STATUS OF THE FOUR CONDITIONS, DIRECT ID.
                                ;          (NOTE THAT THIS IS SPECIFICALLY INTENDED
                                ;          FOR THE MULTI-FREQUENCY BOARD APPLICATION.
                                ;          OTHER IC'S, SUCH AS THE PAL'S, WILL CAUSE
                                ;          UNMEANINGFUL CONDITION CODE DISPLAYS)
                                ;
                                ;
                                ;
                                ;       FALTD PROJECT   AUGUST 26, 1981
                                ;
                                ;
                                ;       MEMORY AND VARIABLE ASSIGNMENTS
                                ;
      5000                      MASK    EQU     5000H           ;MASK ARRAY
      4400                      DISP    EQU     4400H           ;DISPLAY ARRAY
      5000                      Y       EQU     5000H           ;Y ARRAY
      5F00                      TMP     EQU     5F00H           ;TEMPORARY ACC STORAGE
      5F01                      SUMSQ   EQU     TMP+1           ;SUM OF MASK SQUARES
      5F03                      CSUMSQ  EQU     SUMSQ+2         ;SUM OF COMPLEMENT MASK SQUARES
      5F05                      SQA     EQU     CSUMSQ+2        ;SQUARING ROUTINE ARG
      5F09                      ARG1    EQU     SQRA+2          ;DBL PREC ADD ARG AND ANSWER
      5F0B                      ARG2    EQU     ARG1+2          ;DBL PREC ADD ARG
                                ;
                                ;

                                        ASEG
                                        ORG     800H
      0800  21 00 44            MGEN:   LXI H,DISP      ;SEQUENCY DOMAIN COEFF POINTER
      0803  01 00 00                    LXI B,0         ;COEFF COUNTER
      0806  AF                          XRA A           ;CLEAR ACC
      0807  77                          MOV M,A         ;ZERO THE FIRST SEQUENCY TERM
                                                        ;(DC COMPONENT)
      0808  32 09 5F                    STA ARG1        ;INIT ADD ARG'S
      080B  32 0A 5F                    STA ARG1+1      ;
      080E  7E                  MLOOP:  MOV A,M         ;GET NEXT COEFF
      080F  E6 80                       ANI 80H         ;TEST SIGN
      0811  F2 16 08                    JP POSVL        ;JUMP IF POSITIVE
      0814  2F                  NEGVL:  CMA             ;FORM ABSOLUTE VALUE OF COEFF
      0815  3C                          INR A           ;(2'S COMPLEMENT OF NEG)
      0816  32 0B 5F            POSVL:  STA ARG2        ;PUT INTO ADD ARG
      0819  AF                          XRA A           ;CLEAR ACC
      081A  32 0C 5F                    STA ARG2+1      ;CLEAR MSB OF ADD ARG
      081D  CD E3 08                    CALL DPADD      ;ADD (DBL PREC)
      0820  23                          INX H           ;INCRE COEFF POINTER
      0821  03                          INX B           ;INCRE LOOP COUNTER
      0822  3E 04                       MVI A,04H       ;CHECK IF B,C=0400H
      0824  B8                          CMP B           ;DONE?
      0825  C2 0E 08                    JNZ MLOOP       ;LOOP UNTIL DONE
      0828  3A 0A 5F            ACDONE: LDA ARG1+1      ;MSB OF CITY BLOCK SUM
      082B  F6 00                       ORI 0           ;TEST IF ZERO
      082D  CA 46 08                    JZ OKAY         ;JUMP IF ZERO (D.U.T. IS OKAY)
      0830  FE 01                       CPI 01H         ;ELSE, CHECK IF SUM < 110H
      0832  C2 3E 08                    JNZ FAULT       ;IF SUM >= 200H, JUMP (FAULTY IC)
      0835  3A 09 5F                    LDA ARG1        ;LSB OF CITY BLOCK SUM
      0838  FE 10                       CPI 10H         ;SUM < 110H?
      083A  DA 46 08                    JC OKA          ;CARRY SET IF ALL < 10H
      083D  AF                  FAULT:  XRA A           ;CLEAR A
      083E  F6 02                       ORI 02H         ;SET BIT 1
      0840  2F                          CMA             ;OUTPUTS ARE INVERTED
      0841  D3 20                       OUT 20H         ;TURN ON THE RED LAMP
      0843  C3 4E 08                    JMP ICDNE       ;NOW CHECK CONDITIONS
      0846  AF                  OKAY:   XRA A           ;CLEAR ACC
      0847  F6 01                       ORI 01H         ;SET BIT 0
      0849  2F                          CMA             ;OUTPUTS ARE INVERTED
      084A  D3 20                       OUT 20H         ;TURN ON THE GREEN LAMP

      084C  [illegible]         ICDNE:  XRA A           ;CLEAR ACC
            [illegible]                 [illegible]     ;CLEAR THE CONDITION FLAGS
            [illegible]                 [illegible]     ;[illegible] ARG
            21 [illegible]              LXI D,20H       ;DC SEQUENCY COEFF PEAK OFFSET
            19                          DAD D           ;ADD OFFSET
```

```
0857  7E                     MOV A,M      ;GET COEFF
0858  F6 00                  ORI 0        ;TEST SIGN
085A  F2 5F 08               JP APOS      ;JUMP IF POSITIVE
085D  2F           ANEG:     CMA          ;2'S COMPLEMENT
085E  3C                     INR A        ;
085F  FE 12        APOS:     CPI 12H      ;COEFF < 12H?
0861  DA 6C 08               JC NOA       ;JUMP IF NOT
0864  3A 00 5F               LDA TMP      ;GET COND FLAG WORD
0867  F6 01                  ORI 01H      ;SET A FLAG (BIT #0)
0869  32 00 5F               STA TMP      ;SAVE
086C               NOA:
086C  21 00 50               LXI H,Y      ;Y ARRAY ADDR
086F  11 60 00               LXI D,96D    ;B SEQUENCY COEFF PEAK OFFSET
0872  19                     DAD D        ;ADD OFFSET
0873  7E                     MOV A,M      ;GET COEFF
0874  F6 00                  ORI 0        ;TEST SIGN
0876  F2 7B 08               JP BPOS      ;JUMP IF POSITIVE
0879  2F           BNEG:     CMA          ;2'S COMPLEMENT
087A  3C                     INR A        ;
087B  FE 12        BPOS:     CPI 12H      ;COEFF < 12H?
087D  DA 88 08               JC NOB       ;JUMP IF NOT
0880  3A 00 5F               LDA TMP      ;GET COND FLAG WORD
0883  F6 02                  ORI 02H      ;SET B FLAG (BIT #1)
0885  32 00 5F               STA TMP      ;SAVE
0888               NOB:
0888  21 00 50               LXI H,Y      ;Y ARRAY ADDR
088B  11 44 00               LXI D,68D    ;ALTERNATE B SEQ COEFF PEAK OFFSET
088E  19                     DAD D        ;ADD OFFSET
088F  7E                     MOV A,M      ;GET COEFF
0890  F6 00                  ORI 0        ;TEST SIGN
0892  F2 97 08               JP BBPOS     ;JUMP IF POSITIVE
0895  2F           BBNEG:    CMA          ;2'S COMPLEMENT
0896  3C                     INR A        ;
0897  FE 12        BBPOS:    CPI 12H      ;COEFF < 12H?
0899  DA A4 08               JC NOBB      ;JUMP IF NOT
089C  3A 00 5F               LDA TMP      ;GET COND FLAG WORD
089F  F6 02                  ORI 02H      ;SET B FLAG (BIT #1)
08A1  32 00 5F               STA TMP      ;SAVE
08A4               NOBB:
08A4  21 00 50               LXI H,Y      ;Y ARRAY ADDR
08A7  11 0C 00               LXI D,12D    ;C SEQUENCY COEFF PEAK OFFSET
08AA  19                     DAD D        ;ADD OFFSET
08AB  7E                     MOV A,M      ;GET COEFF
08AC  F6 00                  ORI 0        ;TEST SIGN
08AE  F2 B3 08               JP CPOS      ;JUMP IF POSITIVE
08B1  2F           CNEG:     CMA          ;2'S COMPLEMENT
08B2  3C                     INR A        ;
08B3  FE 12        CPOS:     CPI 12H      ;COEFF < 12H?
08B5  DA C0 08               JC NOC       ;JUMP IF NOT
08B8  3A 00 5F               LDA TMP      ;GET COND FLAG WORD
08BB  F6 04                  ORI 04H      ;SET C FLAG (BIT #2)
08BD  32 00 5F               STA TMP      ;SAVE
08C0               NOC:
08C0  21 00 50               LXI H,Y      ;Y ARRAY ADDR
08C3  11 80 00               LXI D,128D   ;D SEQUENCY COEFF PEAK OFFSET
08C6  19                     DAD D        ;ADD OFFSET
08C7  7E                     MOV A,M      ;GET COEFF
08C8  F6 00                  ORI 0        ;TEST SIGN
08CA  F2 CF 08               JP DPOS      ;JUMP IF POSITIVE
08CD  2F           DNEG:     CMA          ;2'S COMPLEMENT
08CE  3C                     INR A        ;
08CF  FE 12        DPOS:     CPI 12H      ;COEFF < 12H?
08D1  DA DC 08               JC NOD       ;JUMP IF NOT
08D4  3A 00 5F               LDA TMP      ;GET COND FLAG WORD
08D7  F6 08                  ORI 08H      ;SET D FLAG (BIT #3)
08D9  32 00 5F               STA TMP      ;SAVE
08DC               NOD:
                                          ;CONDITION FLAGS ARE NOW SET
                                          ;FOR THIS D.U.T.
08DC  3A 00 5F               LDA TMP      ;GET COND FLAG WORD
08DF  2F                     CMA          ;OUTPUTS ARE INVERTED
08E0  D3 21                  OUT 21H      ;DISPLAY CONDITION FLAGS
08E2  C9                     RET          ;EXIT BACK TO MAIN PROGRAM
                   PRAMF:                 [illegible]
[illegible]
                             END

ASSEMBLER ERRORS =    0
```

FWHT MASK ANALYSIS

CROSS REFERENCE

| LABEL | VALUE | REFERENCE | | | | | | | | |
|---|---|---|---|---|---|---|---|---|---|---|
| [illegible] | 00[illegible] | -84 | | | | | | | | |
| [illegible] | [illegible] | -111 | | | | | | | | |
| [illegible] | [illegible] | 109 | -112 | | | | | | | |
| [illegible] | 5F07 | 55 | 56 | 67 | 68 | 84 | 85 | 184 | | |
| AFG2 | 5F6F | -58 | 74 | 76 | 185 | | | | | |
| [illegible] | [illegible] | -138 | | | | | | | | |
| [illegible] | [illegible] | 137 | -140 | | | | | | | |
| [illegible] | [illegible] | 124 | | | | | | | | |
| [illegible] | [illegible] | 123 | -126 | | | | | | | |
| [illegible] | [illegible] | -152 | | | | | | | | |
| [illegible] | 00[illegible] | 151 | -154 | | | | | | | |
| CSUMSQ | 5F03 | -52 | 53 | | | | | | | |
| [illegible] | 4400 | -48 | 62 | | | | | | | |
| [illegible] | [illegible] | 162 | | | | | | | | |
| [illegible] | [illegible] | 165 | -166 | | | | | | | |
| [illegible] | [illegible] | 88 | 92 | | | | | | | |
| [illegible] | 0040 | 96 | -102 | | | | | | | |
| MASK | 5A00 | -47 | | | | | | | | |
| MEMORY M | 0000 | 0 | | | | | | | | |
| [illegible] | 0000 | -67 | | | | | | | | |
| [illegible] | 080F | -69 | 82 | | | | | | | |
| [illegible] | 0000 | 0 | | | | | | | | |
| [illegible] | 0014 | -72 | | | | | | | | |
| [illegible] | 0060 | 113 | -117 | | | | | | | |
| [illegible] | 008B | 127 | -131 | | | | | | | |
| [illegible] | [illegible] | 141 | -145 | | | | | | | |
| [illegible] | [illegible] | 155 | -159 | | | | | | | |
| [illegible] | [illegible] | 169 | -173 | | | | | | | |
| [illegible] | 0043 | 86 | 91 | -97 | | | | | | |
| [illegible] | 0016 | 71 | -74 | | | | | | | |
| [illegible] | 0012 | 77 | -181 | | | | | | | |
| [illegible] | 5F0[illegible] | -53 | 54 | | | | | | | |
| [illegible] | 5F0[illegible] | -54 | 55 | | | | | | | |
| [illegible] S | 0000 | 0 | | | | | | | | |
| SUMSQ | 5F01 | -51 | 52 | | | | | | | |
| [illegible] | 5F00 | -50 | 51 | 103 | 114 | 116 | 128 | 130 | 142 |
| | | 144 | 156 | 150 | 170 | 172 | 176 | | | |
| [illegible] | 5000 | -49 | 104 | 118 | 132 | 146 | 160 | | | |

We claim:

1. A test system for comparatively analyzing a complex signal indicative of the operational status of apparatus to be tested comprising in combination:

(a) apparatus for sampling a first signal known to have predetermined characteristics indicative of a predetermined operational status of said apparatus to produce reference data base;

(b) apparatus for processing said reference data base to produce reference transform coefficients having a predetermined relationship to said first signal;

(c) apparatus for sampling a second signal whose characteristics are indicative of an unknown operational status of the system to be tested to produce a comparison data base;

(d) apparatus for processing said comparison data base to produce comparison transform coefficients; and (e) apparatus for comparing said reference transform coefficients to said comparison transform coefficients to determine the operational status of said apparatus.

2. A test system comprising:

(a) apparatus selectably coupled to a reference circuit of the type whose operational status is to be determined to generate an output signal indicative of the operational status of said reference circuit;

(b) apparatus for periodically sampling said output signal to generate a reference data base, said reference data base being indicative of a predetermined operational status of said reference circuit;

(c) apparatus for processing said reference data base to generate a reference transform;

(d) apparatus selectably coupled to a circuit whose operational status is to be determined to generate an output signal indicative of the operational status of said circuit whose operational status is to be determined;

(e) apparatus for periodically sampling said output signal indicative of the operational status of said circuit whose operational status is to be determined to generate a comparison data base;

(f) apparatus for processing said comparison data base to generate a comparison transform;

(g) apparatus for processing said reference transform and said comparison transform to determine the operational status of said circuit whose operational status is to be determined.

3. A test system comprising:

(a) apparatus for generating a reference data base related to a known operational status of an electric circuit;

(b) apparatus for periodically sampling the output signal of a probe positioned to sample the electric field generated by an electrical circuit whose operational status is to be determined to generate a comparison data base;

(c) apparatus for comparing said reference data base to said second comparison data base to determine the operational status of said electrical circuit.

4. A test system, comprising in combination:

(a) apparatus for coupling a signal indicative of the operational status of a circuit to be tested to a digital sampling circuit to generate a data base indicative of the operational status of said circuit;

(b) apparatus for storing said data base;

(c) comparison apparatus for comparing a data base related to a known operational status of said circuit to said data base indicative of the operational status of said circuit by comparing the "city block" distance between the array vector corresponding to said known operational status and the vector corresponding to said unknown operational status to a predetermined threshold value.

5. A test system in accordance with claim 4 wherein said predetermined threshold is selected to differentiate between operational errors of a circuit to be tested and normally expected variation between normally operating circuits of the same type.

6. A method for testing an electrical circuit, comprising the steps of:

(a) coupling a probe to a circuit of the type to be tested to generate a signal indicative of the operational status of the circuit;

(b) utilizing sampling apparatus to sample said signal to generate digital numbers;

(c) utilizing storage means to store said digital numbers to generate a first data base related to the operational status of said circuit;

(d) utilizing digital computer means to compare a second data base related to a known operational status of said circuit to said first data base utilizing Walsh Transform processing techniques to determine if the operational status implied by said first data base meets predetermined criteria.

7. A method of testing electrical apparatus in accordance with claim 6 further including the step of utilizing computing means to calculate the "city block" distance between the array vector of said first data base and said second data base to generate a difference signal and comparing this difference signal to a threshold, said predetermined criteria requiring said data base difference signal have a predetermined relationship to said threshold.

8. A method of testing electrical apparatus in accordance with claim 6 further including the step of empirically selecting said predetermined relationship between said data base difference signal and said threshold to distinguish between circuit malfunction and normal variations between circuits of the same design.

* * * * *